US012293926B2

(12) United States Patent
Nelson et al.

(10) Patent No.: US 12,293,926 B2
(45) Date of Patent: May 6, 2025

(54) FACILITATING FORMATION OF A VIA IN A SUBSTRATE

(71) Applicant: MOSAIC MICROSYSTEMS LLC, Rochester, NY (US)

(72) Inventors: Shelby Forrester Nelson, Pittsford, NY (US); David Howard Levy, Rochester, NY (US)

(73) Assignee: MOSAIC MICROSYSTEMS LLC, Rochester, NY (US)

( * ) Notice: Subject to any disclaimer, the term of this patent is extended or adjusted under 35 U.S.C. 154(b) by 454 days.

(21) Appl. No.: 17/723,701

(22) Filed: Apr. 19, 2022

(65) Prior Publication Data
US 2022/0270892 A1    Aug. 25, 2022

Related U.S. Application Data

(63) Continuation of application No. PCT/US2020/059387, filed on Nov. 6, 2020.

(60) Provisional application No. 62/932,536, filed on Nov. 8, 2019.

(51) Int. Cl.
*H01L 21/48* (2006.01)
*H01L 23/15* (2006.01)
*H01L 23/498* (2006.01)

(52) U.S. Cl.
CPC ............ *H01L 21/486* (2013.01); *H01L 23/15* (2013.01); *H01L 23/49827* (2013.01)

(58) Field of Classification Search
CPC ............ H01L 21/486; H01L 21/76877; H01L 21/76898; H01L 23/15; H01L 23/49827
See application file for complete search history.

(56) References Cited

U.S. PATENT DOCUMENTS

| 5,763,903 | A | 6/1998 | Mandai |
| 10,134,657 | B2 | 11/2018 | Levesque, Jr. |
| 10,201,867 | B2* | 2/2019 | Ono ............... B23K 26/384 |
| 10,470,300 | B1* | 11/2019 | Seki ............... H05K 1/0269 |
| 2012/0045611 | A1 | 2/2012 | Shih |
| 2012/0315739 | A1 | 12/2012 | Hashii |

(Continued)

FOREIGN PATENT DOCUMENTS

WO     2018217696 A2    11/2018

OTHER PUBLICATIONS

Levy. Copending U.S. Appl. No. 18/383,231, filed Oct. 24, 2023.
(Continued)

*Primary Examiner* — Eric A. Ward
(74) *Attorney, Agent, or Firm* — ROSSI, KIMMS & McDOWELL LLP

(57) ABSTRACT

An inorganic substrate with an improved via shape and methods for facilitating formation of such improved via shape are disclosed. A double-sided opening process may be applied to an inorganic substrate to form openings at the ends of a damage track previously formed in the inorganic substrate. One side of the inorganic substrate may then be sealed, such as by being temporarily bonded to a carrier or blocking substrate, so that a single-sided opening process may be applied to the other unsealed or unblocked surface of the inorganic substrate. The single-sided opening process may enlarge at least one of the openings formed by the double-sided opening process and may enlarge a channel between the openings to form a via having an advantageous shape.

16 Claims, 7 Drawing Sheets

SE2  17.5mm  500X  0.5°

(56) References Cited

U.S. PATENT DOCUMENTS

| | | | |
|---|---|---|---|
| 2013/0034687 A1 | 2/2013 | Koike et al. | |
| 2013/0037922 A1 | 2/2013 | Arriagada et al. | |
| 2013/0075739 A1 | 3/2013 | Loy | |
| 2015/0060402 A1 | 3/2015 | Burkett | |
| 2016/0069379 A1 | 3/2016 | Bae | |
| 2017/0036419 A1 | 2/2017 | Adib | |
| 2018/0005922 A1 | 1/2018 | Levesque, Jr. | |
| 2018/0047630 A1 | 2/2018 | Kato et al. | |
| 2018/0294209 A1 | 10/2018 | Yoon | |
| 2018/0317319 A1* | 11/2018 | Mori | H05K 1/0306 |
| 2018/0342450 A1 | 11/2018 | Huang et al. | |
| 2018/0342451 A1 | 11/2018 | Dahlberg | |
| 2019/0109034 A1 | 4/2019 | Fehkuhrer | |
| 2019/0185373 A1 | 6/2019 | Hu | |
| 2019/0312067 A1 | 10/2019 | Garner et al. | |
| 2020/0354267 A1 | 11/2020 | Cai et al. | |

OTHER PUBLICATIONS

Extended European Search Report issued in European Appln. No. 20884706.1, mailed Nov. 8, 2023.
International Search Report issued in Intl. Appln. No. PCT/US2020/059407 mailed Mar. 18, 2021.
Written Opinion issued in Intl. Appln. No. PCT/US2020/059407 mailed Mar. 18, 2021.
International Preliminary Report on Patentability issued in Intl. Appln. No. PCT/US2020/059407 mailed Nov. 4, 2021.
Copending U.S. Appl. No. 17/724,068, filed Apr. 19, 2022.
International Preliminary Report on Patentability issued in Intl. Appln. No. PCT/US2022/025924 mailed Aug. 31, 2023.
Notice of Allowance issued in U.S. Appl. No. 17/724,068 mailed Apr. 16, 2024.
International Search Report issued in Intl. Appln. No. PCT/US2022/025924 mailed Jul. 28, 2022.
Written Opinion issued in Intl. Appln. No. PCT/US2022/025924 mailed Jul. 28, 2022.
"Borosilicate glass", Wikipedia. 2012, Retrieved from the Internet on Jun. 17, 2022. <https://en.wikipedia.org/wiki/Borosilicate_glass> Cited in NPL 1.
Ostholt. "High speed through glass via manufacturing technology for interposer." Proceedings of the 5th Electronics System-integration Technology Conference (ESTC). IEEE, 2014. Cited in specification.
Gillis. "Double-Cantilever Cleavage Mode of Crack Propagation", Journal of Applied Physics. 1964: 647-658. vol. 35, No. 3. Cited in Specification.
International Search Report issued in Intl. Appln. No. PCT/US2020/059387 mailed Feb. 4, 2021.
Written Opinion issued in Intl. Appln. No. PCT/US2020/059387 mailed Feb. 4, 2021.
Communication under Rule 71(3) EPC issued in European Appln. No. 20884706.1 mailed Oct. 28, 2024.

* cited by examiner

ABBR US 12,293,926 B2

FACILITATING FORMATION OF A VIA IN A SUBSTRATE

CROSS-REFERENCE TO RELATED APPLICATIONS

This application is a Bypass Continuation application of International Application No. PCT/US2020/059387, filed Nov. 6, 2020, which claims the benefit of U.S. Provisional Application No. 62/932,536, filed Nov. 8, 2019, the entire disclosure of each of these applications is hereby incorporated herein by reference.

STATEMENT OF GOVERNMENT INTEREST

This invention was made with government support under 1843230 awarded by the National Science Foundation. The government has certain rights in the invention.

TECHNICAL FIELD

Aspects of this disclosure generally are related to the formation of one or more vias in a substrate, such as an inorganic substrate, which may be glass.

BACKGROUND

Insulating substrates with precisely formed and positioned through-holes, or vias, have many applications in electronic and photonic packaging. A through-substrate via can be filled with conductive material to provide a vertical electrical connection that passes completely through the substrate. A via may be a hole through the substrate that is large enough to fill with conductive material, in order to conduct electrical signals from one surface of the substrate to the other. Glass has many advantages as a substrate, including that it can be formed in large sheets of uniform thickness with very smooth surfaces, is dimensionally stable, and relatively rigid. Glass can be formed with those good properties at thicknesses well below 0.5 mm.

The through-holes to be filled with conductive material can be formed by a variety of methods, including lithography of photolithographic glass, sand-blasting, electric discharge drilling, swift heavy ion tracks, and many versions of laser drilling. In some cases, the holes are formed to the correct opening size directly. In others, the positions of the vias are established by a method which creates a damage track or preformed opening or pilot hole in the glass, while a subsequent wet etching process enlarges the damage track to create a through-hole with the desired diameter.

When processing a material, such as glass, the details of the via formation typically have to be carefully designed to create smooth, circular, vias of the correct opening diameter with low cracking around the holes. Furthermore, speed of sample throughput and capital costs for the manufacturing equipment are important parameters for a manufacturing process. See, Ostholt, Roman, et al. "High speed through glass via manufacturing technology for interposer." Proceedings of the 5th Electronics System-integration Technology Conference (ESTC). IEEE, 2014. Such considerations have directed considerable attention to approaches that involve first the creation of the above-mentioned damage track/pilot hole, and then a subsequent wet-etch to enlarge the hole In this regard, FIGS. 1A-1C illustrate a conventional via formation process, where, as shown in FIG. 1A, a single-sided wet-etching process is applied to a first surface 400a of a glass substrate 400 having a damage track 40 formed therein to create a via 45 (FIG. 1). To protect the second surface 400b from the wet-etching process, a sealant material layer 450 is applied to the second surface 400b.

When substrate 400 is immersed in etch solution, the etch will begin at the exposed surface 400a and progress so that the largest diameter of the via 45 is at the top first surface 400a, represented by opening 45a of via 45 in FIG. 1B. Once the via 45 is etched through to the sealed second surface 400b, as shown in FIG. 1B, the etching must continue to be applied further to enlarge the opening 45b in FIG. 1B on the sealed second surface 400b to the desired diameter, 20tb shown in FIG. 1C. This added duration of the wet etch means that the top diameter 20ra in FIG. 1B also continues to grow to a potentially undesired diameter 20ta as shown in FIG. 1C, resulting in a tapered through-hole. In this regard, the present inventors recognized that one potential difficulty of this single-sided wet etching process is that the final diameter of the top opening of the via 45 in the exposed first surface 400a is dependent on the thickness 410 of the substrate 400 and the desired diameter of the bottom opening of the via 45 in the sealed second surface 400b. Thus, the density of vias in the substrate 400 is limited by this conventional single-sided wet etching process due to the relatively large size of the via openings (e.g., opening 45a) in the exposed first surface 400a of the substrate 400, and the achievable size of via 45 is tied directly to and possibly limited by the thickness 410 of the substrate 400.

Another difficulty frequently encountered in this single-sided wet etching process recognized by the present inventors is that wet etching can readily occur along the interface 46 (FIG. 1C) between the sealant material layer 450 and the second surface 400b of the substrate 400, once the hole through the substrate 400 allows the etchant to reach that interface 46. This situation causes lateral etching along the interface 46, causing an undercutting or laterally-etched region 47 (FIG. 1C) that grows with time during the etching. The laterally-etched region 47 can achieve a diameter 59 considerably larger than the diameter 20ta of the opening 45a at the surface 400a. As shown in FIG. 1C, the diameter 20ta of the top opening 45a of the via 45 is much smaller than the diameter 59 of the laterally-etched region 47. The present inventors recognize that the presence of such a large undercut or laterally-etched region 47 is not preferred and can be harmful to performance.

Accordingly, the present inventors recognized that the conventional single sided wet etching process of FIGS. 1A-1C is less preferable due at least to the presence of the large undercutting or laterally-etched region 47 and the relatively large diameter 20ta exhibited by the opening 45a in the exposed first surface 400a of the substrate 400, which limits via density. The present inventors also recognized that a lack of control exists over opening diameter 20ta, which is dependent on the thickness 410 of the substrate 400.

Therefore, the present inventors recognized that a need in the art exists for improved via formation.

SUMMARY

At least the above-discussed need is addressed and technical solutions are achieved in the art by various embodiments of the present invention. According to some embodiments, a method of facilitating formation of a via in an inorganic substrate includes applying a double-sided opening process to the inorganic substrate. The inorganic substrate may include a damage track including a first end in a first surface of the inorganic substrate and a second end in a second surface of the inorganic substrate. The second surface may be on an opposite side of the inorganic substrate than the first surface of the inorganic substrate. The double-sided opening process may enlarge at least a first dimension of the first end of the damage track to form a first opening in the first surface of the inorganic substrate. The first dimension of the first end of the damage track may be measured within a plane of the first surface of the inorganic substrate. The double-sided opening process may enlarge at least a first dimension of the second end of the damage track to form a first opening in the second surface of the inorganic substrate. The first dimension of the second end of the damage track may be measured within a plane of the second surface of the inorganic substrate. A pathway may extend between the first opening in the first surface of the inorganic substrate and the first opening in the second surface of the inorganic substrate. The pathway may include a longitudinal axis perpendicular to (a) an extension direction of the first surface of the inorganic substrate, (b) an extension direction of the second surface of the inorganic substrate, or both (a) and (b). The pathway may include varying diameters of lateral cross-sections taken perpendicular to the longitudinal axis of the pathway, and the pathway may include a waist coinciding with a lateral cross-section of the pathway taken perpendicular to the longitudinal axis at a point of minimum diameter of the varying diameters of the pathway. The method may include applying a single-sided opening process to the first surface of the inorganic substrate, after completion of the double-sided opening process. The single-sided opening process may enlarge at least a first dimension of the first opening in the first surface of the inorganic substrate to form a second opening in the first surface of the inorganic substrate. The single-sided opening enlargement process may move the waist of the pathway closer to the second surface of the inorganic substrate as compared to a location of the waist after completion of the double-sided opening process but before applying the single-sided opening process. The moving of the waist may form a resultant pathway. The single-sided opening process may cause a via formed in the inorganic substrate to comprise the second opening in the first surface of the inorganic substrate, a resultant second opening in the second surface of the inorganic substrate, and the resultant pathway. The resultant pathway may extend from the second opening in the first surface of the inorganic substrate to the resultant second opening in the second surface of the inorganic substrate.

In some embodiments, the double-sided opening process includes a wet etching process concurrently applied to the first surface of the inorganic substrate and the second surface of the inorganic substrate. In some embodiments, the wet etching process includes application of an etching composition comprising an HF concentration less than 1M and a strong acid concentration greater than 0.8M.

In some embodiments, the single-sided opening process comprises a wet etching process applied to the first surface of the inorganic substrate, but not to the second surface of the inorganic substrate.

In some embodiments, the inorganic substrate is glass. In some embodiments, the damage track is or was formed by a laser.

In some embodiments, a ratio of (a) a diameter of the first opening in the first surface of the inorganic substrate to (b) a diameter of the first opening in the second surface of the inorganic substrate is in a range of 0.7 to 1.3, and the diameter of the first opening in the first surface of the inorganic substrate and the diameter of the first opening in the second surface of the inorganic substrate are measured along parallel line segments.

In some embodiments, a ratio of (a) a diameter of the second opening in the first surface of the inorganic substrate to (b) a diameter of the resultant second opening in the second surface of the inorganic substrate is in a range of 1.2 to 3, and the diameter of the second opening in the first surface of the inorganic substrate and the diameter of the resultant second opening in the second surface of the inorganic substrate are measured along parallel line segments.

In some embodiments, a ratio of (a) a diameter of the second opening in the first surface of the inorganic substrate to (b) a diameter of the waist of the resultant pathway upon completion of the single-sided opening process is in a range of 1.2 to 3, and the diameter of the second opening in the first surface of the inorganic substrate and the diameter of the waist of the resultant pathway are measured along parallel line segments.

In some embodiments, a diameter of the second opening in the first surface of the inorganic substrate is at least 25% larger than a corresponding diameter of the resultant second opening in the second surface of the inorganic substrate, and the diameter of the second opening in the first surface of the inorganic substrate and the corresponding diameter of the resultant second opening in the second surface of the inorganic substrate are measured along parallel line segments.

In some embodiments, a diameter of the first opening in the second surface of the inorganic substrate is within 20% of a corresponding diameter of the resultant second opening in the second surface of the inorganic substrate, and the diameter of the first opening in the second surface of the inorganic substrate and the corresponding diameter of the resultant second opening in the second surface of the inorganic substrate are measured along parallel line segments.

In some embodiments, after completion of the single-sided opening process, the resultant pathway has a trumpet shape or a conical frustum shape. In some embodiments, after completion of the double-sided opening process but before application of the single-sided opening process, the pathway has an hourglass shape.

In some embodiments, after completion of the double-sided opening process but before application of the single-sided opening process, a longitudinal cross-section of the pathway taken along the longitudinal axis of the pathway does not have a trumpet shape and does not have a conical frustum shape.

In some embodiments, the method further includes bonding a semiconductor substrate to the second surface of the inorganic substrate after completion of the double-sided opening process, but before applying the single-sided opening process. In some embodiments, the bonding is Van der Waals bonding or Van der Waals bonding assisted by covalent bonding.

In some embodiments, the method further includes temporarily bonding the inorganic substrate to a semiconductor substrate using a deposited carbonaceous layer. In some embodiments, the semiconductor substrate is silicon. In some embodiments, the deposited carbonaceous layer comprises an amorphous carbon, an amorphous hydrogenated carbon, a diamond, a diamond-like carbon, or a fluorine containing carbon film. In some embodiments, the semiconductor substrate is silicon, and the deposited carbonaceous layer comprises an amorphous carbon, an amorphous hydrogenated carbon, a diamond, a diamond-like carbon, or a fluorine containing carbon film.

In some embodiments, a cross-section of the second opening in the first surface of the inorganic substrate, taken perpendicular to a longitudinal axis of the resultant pathway, has a circular shape, the longitudinal axis of the resultant pathway perpendicular to (c) an extension direction of the first surface of the inorganic substrate, (d) an extension direction of the second surface of the inorganic substrate, or both (c) and (d).

In some embodiments, a cross-section of the resultant second opening in the second surface of the inorganic substrate, taken perpendicular to a longitudinal axis of the pathway, has a circular shape, the longitudinal axis of the resultant pathway perpendicular to (c) an extension direction of the first surface of the inorganic substrate, (d) an extension direction of the second surface of the inorganic substrate, or both (c) and (d).

In some embodiments, the method further includes, after completion of the double-sided opening process, but before applying the single-sided opening process, depositing an inorganic carbon-containing film on a surface of a blocking substrate and bonding the inorganic carbon-containing film to the second surface of the inorganic substrate.

In some embodiments, the double-sided opening process produces a via through the inorganic substrate from the damage track.

In some embodiments, the single-sided opening process occurs with etching conditions exhibiting a Thiele modulus greater than 1.1. In some embodiments, the single-sided opening process occurs with etching conditions exhibiting a Thiele modulus in a range of 1.1 to 10, inclusive. In some embodiments, the single-sided opening process occurs with etching conditions exhibiting a Thiele modulus in a range of 2 to 10, inclusive. In some embodiments, the double-sided opening process occurs with etching conditions exhibiting a Thiele modulus less than 0.9. In some embodiments, the double-sided opening process occurs with etching conditions exhibiting a Thiele modulus in a range of 0.1 to 0.9, inclusive. In some embodiments, the double-sided opening process occurs with etching conditions exhibiting a Thiele modulus in a range of 0.1 to 0.5, inclusive. Various embodiments exhibit all possible permutations of the double-sided opening process and single-sided opening process Thiele modulus ranges included in this paragraph.

In some embodiments, prior to applying the double-sided opening process, a thickness of the inorganic substrate is between 300 micrometers and 10 micrometers.

According to some embodiments, a method of facilitating formation of a via in an inorganic substrate includes bonding a semiconductor substrate to a second surface of the inorganic substrate. The inorganic substrate may include a first opening in a first surface of the inorganic substrate, the second surface on an opposite side of the inorganic substrate than the first surface of the inorganic substrate. In some embodiments, the inorganic substrate includes a first opening in the second surface of the inorganic substrate and includes a via including the first opening in the first surface of the inorganic substrate, the first opening in the second surface of the inorganic substrate, and a channel extending from the first opening in the first surface of the inorganic substrate at least toward the first opening in the second surface of the inorganic substrate. The channel may include a longitudinal axis perpendicular to (a) an extension direction of the first surface of the inorganic substrate, (b) an extension direction of the second surface of the inorganic substrate, or both (a) and (b). The channel may include varying diameters of lateral cross-sections taken perpendicular to the longitudinal axis of the channel. The via may include a waist coinciding with a lateral cross-section taken perpendicular to the longitudinal axis at a point of minimum diameter of the varying diameters of the channel. The method may include applying a single-sided opening process to the first surface of the inorganic substrate, after the bonding of the semiconductor substrate to the second surface of the inorganic substrate. The single-sided opening process may enlarge at least a first dimension of the first opening in the first surface of the inorganic substrate to form a second opening in the first surface of the inorganic substrate. The single-sided opening process may cause the via to include the second opening in the first surface of the inorganic substrate and a resultant second opening in the second surface of the inorganic substrate with the channel extending from the second opening in the first surface of the inorganic substrate to the resultant second opening in the second surface of the inorganic substrate. The single-sided opening process may move the waist of the channel closer to the second surface of the inorganic substrate.

In some embodiments, the inorganic substrate is glass. In some embodiments, the channel is or was formed by a laser.

In some embodiments, a ratio of (a) a diameter of the first opening in the first surface of the inorganic substrate to (b) a diameter of the first opening in the second surface of the inorganic substrate is in a range of 0.7 to 1.3, and the diameter of the first opening in the first surface of the inorganic substrate and the diameter of the first opening in the second surface of the inorganic substrate are measured along parallel line segments.

In some embodiments, a ratio of (a) a diameter of the second opening in the first surface of the inorganic substrate to (b) a diameter of the resultant second opening in the second surface of the inorganic substrate is in a range of 1.2 to 3, and the diameter of the second opening in the first surface of the inorganic substrate and the diameter of the resultant second opening in the second surface of the inorganic substrate are measured along parallel line segments.

In some embodiments, a ratio of (a) a diameter of the second opening in the first surface of the inorganic substrate to (b) a diameter of the waist of the channel upon completion of the single-sided opening process is in a range of 1.2 to 3, and the diameter of the second opening in the first surface of the inorganic substrate and the diameter of the waist of the channel are measured along parallel line segments.

In some embodiments, a diameter of the second opening in the first surface of the inorganic substrate is at least 25% larger than a corresponding diameter of the resultant second opening in the second surface of the inorganic substrate, and the diameter of the second opening in the first surface of the inorganic substrate and the corresponding diameter of the resultant second opening in the second surface of the inorganic substrate are measured along parallel line segments.

In some embodiments, a diameter of the first opening in the second surface of the inorganic substrate is within 20% of a corresponding diameter of the resultant second opening in the second surface of the inorganic substrate, and the diameter of the first opening in the second surface of the inorganic substrate and the corresponding diameter of the resultant second opening in the second surface of the inorganic substrate are measured along parallel line segments.

In some embodiments, after completion of the single-sided opening process, the channel of the via has a trumpet shape or a conical frustum shape. In some embodiments, immediately before application of the single-sided opening process, the channel has an hourglass shape.

In some embodiments, immediately before application of the single-sided opening process, a longitudinal cross-section of the channel of the via taken along the longitudinal axis of the channel does not have a trumpet shape and does not have a conical frustum shape.

In some embodiments, the bonding comprises temporarily bonding the inorganic substrate to the semiconductor substrate using a deposited carbonaceous layer. In some embodiments, the semiconductor substrate is silicon. In some embodiments, the deposited carbonaceous layer comprises an amorphous carbon, an amorphous hydrogenated carbon, a diamond, a diamond-like carbon, or a fluorine containing carbon film. In some embodiments, the semiconductor substrate is silicon, and the deposited carbonaceous layer comprises an amorphous carbon, an amorphous hydrogenated carbon, a diamond, a diamond-like carbon, or a fluorine containing carbon film.

In some embodiments, the bonding is Van der Waals bonding or Van der Waals bonding assisted by covalent bonding.

In some embodiments, a cross-section of the second opening in the first surface of the inorganic substrate, taken perpendicular to the longitudinal axis of the channel, has a circular shape.

In some embodiments, a cross-section of the resultant second opening in the second surface of the inorganic substrate, taken perpendicular to the longitudinal axis of the channel, has a circular shape.

In some embodiments, the bonding includes depositing an inorganic carbon-containing film on a surface of the semiconductor substrate, and bonding the inorganic carbon-containing film to the second surface of the inorganic substrate.

In some embodiments, the single-sided opening process occurs with etching conditions exhibiting a Thiele modulus greater than 1.1.

In some embodiments, prior to applying the single-sided opening process, a thickness of the inorganic substrate is between 300 micrometers and 10 micrometers.

It should be noted that various embodiments of the present invention include variations of the methods or processes summarized above or otherwise described herein (including the figures) and, accordingly, are not limited to the actions described or shown in the figures or their ordering, and not all actions shown or described are required according to various embodiments. According to various embodiments, such methods may include more or fewer actions and different orderings of actions. Any of the features of all or part of any one or more of the methods or processes summarized above or otherwise described herein (including the figures) may be combined with any of the other features of all or part of any one or more of the methods or processes summarized above or otherwise described herein or shown in the figures.

According to some embodiments, a semiconductor apparatus or semiconductor includes an inorganic substrate and a semiconductor substrate bonded to a second surface of the inorganic substrate. In some embodiments, the second surface of the inorganic substrate is on an opposite side of the inorganic substrate than a first surface of the inorganic substrate. The inorganic substrate may include a via that includes a channel that extends from an opening in the first surface of the inorganic substrate to an opening in the second surface of the inorganic substrate. The channel may include varying diameters of lateral cross-sections taken perpendicular to a longitudinal axis of the channel. The longitudinal axis of the channel may be perpendicular to (a) an extension direction of the first surface of the inorganic substrate, (b) an extension direction of the second surface of the inorganic substrate, or both (a) and (b). The via may include a waist coinciding with a lateral cross-section taken perpendicular to the longitudinal axis at a point of minimum diameter of the varying diameters of the channel. Within a two-dimensional profile of the via taken within a plane that includes the longitudinal axis of the channel, a first angle of a first portion of a wall of the via at the opening in the first surface of the inorganic substrate may be two (2) or more degrees in some embodiments, and four (4) or more degrees in some embodiments, greater than a second angle of a second portion of the wall of the via at the opening in the second surface of the inorganic substrate. Each of the first angle and the second angle may be taken between (i) the first portion or the second portion, respectively, of the wall of the via, and (ii) the longitudinal axis of the via. In some embodiments, the first angle of the first portion of the wall of the via at the opening in the first surface of the inorganic substrate is between two (2) to eight (8) degrees (inclusive) greater than the second angle of the second portion of the wall of the via at the opening in the second surface of the inorganic substrate. In some embodiments, the first angle of the first portion of the wall of the via at the opening in the first surface of the inorganic substrate is between four (4) to eight (8) degrees (inclusive) greater than the second angle of the second portion of the wall of the via at the opening in the second surface of the inorganic substrate.

In some embodiments, the inorganic substrate is glass.

In some embodiments, a ratio of (a) a diameter of the opening in the first surface of the inorganic substrate to (b) a diameter of the opening in the second surface of the inorganic substrate is in a range of 1.2 to 3, and the diameter of the opening in the first surface of the inorganic substrate and the diameter of the opening in the second surface of the inorganic substrate are measured along parallel line segments.

In some embodiments, a ratio of (a) a diameter of the opening in the first surface of the inorganic substrate to (b) a diameter of the waist of the via is in a range of 1.2 to 3, and the diameter of the opening in the first surface of the inorganic substrate and the diameter of the waist of the via are measured along parallel line segments.

In some embodiments, a diameter of the opening in the first surface of the inorganic substrate is at least 25% larger than a corresponding diameter of the opening in the second surface of the inorganic substrate, and the diameter of the opening in the first surface of the inorganic substrate and the corresponding diameter of the opening in the second surface of the inorganic substrate are measured along parallel line segments.

In some embodiments, the via has a trumpet shape or a conical frustum shape.

In some embodiments, the semiconductor substrate is silicon.

In some embodiments, a cross-section of the opening in the first surface of the inorganic substrate, taken perpendicular to the longitudinal axis of the via, has a circular shape.

In some embodiments, a cross-section of the opening in the second surface of the inorganic substrate, taken perpendicular to the longitudinal axis of the via, has a circular shape.

In some embodiments, a thickness of the inorganic substrate is between 300 micrometers and 10 micrometers.

Various embodiments of the present invention may include apparatuses, systems, devices, or machines that are or include combinations or subsets of any one or more of the apparatuses, systems, devices, or machines and associated features thereof summarized above or otherwise described herein.

BRIEF DESCRIPTION OF THE DRAWINGS

It is to be understood that the attached drawings are for purposes of illustrating aspects of various embodiments and may include elements that are not to scale.

DETAILED DESCRIPTION

At least some embodiments of the present invention improve upon at least the above-discussed conventional solely-single-sided etching process for via formation. In some embodiments of the present invention, an inventive double-sided opening process ("DSOP") may be applied to a substrate that includes a damage or pilot track for each planned via in the substrate. The DSOP provides initial openings at each end of each damage track, and may provide the via with an hourglass shape having a 'waist' at or near the middle of the thickness of the substrate, according to some embodiments. Then, a 'bottom' surface or side of the substrate may be sealed, such as according to one or more inventive temporary bonding processes described in more detail below, according to some embodiments. Then, an inventive single-sided opening process ("SSOP") may be applied to the unsealed 'top' surface or side of the substrate. The SSOP may enlarge the opening in the 'top' unsealed surface or side of the substrate for each via, while moving the 'waist' of the respective via closer to the 'bottom' sealed surface or side of the substrate, providing a conical frustum or trumpet shape to each via, according to some embodiments.

Figure 1A:
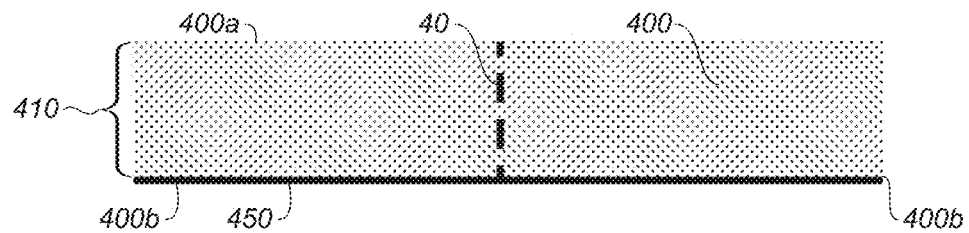
FIGS. 1A-1C illustrate a conventional single-sided etching process.
Figure 1B:
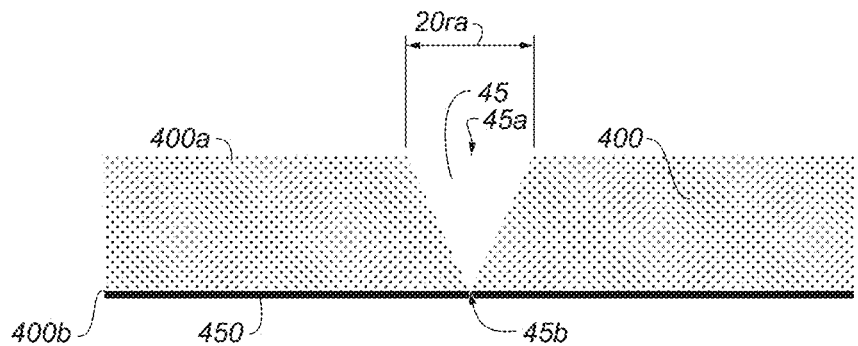
Figure 1C:
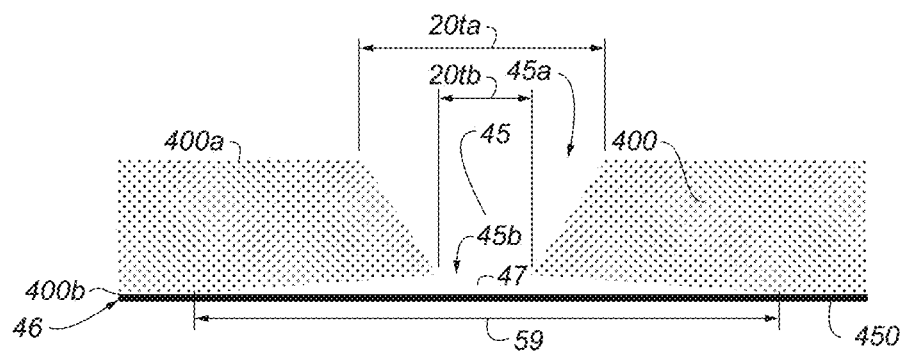

The DSOP and SSOP according to various embodiments of the present invention provide increased control over the shape of the via, while maintaining ease of metallization of the via, since the tapered shape of the resultant via avoids air pockets or other voids during metallization, e.g., by electroplating. In this regard, the ratio of the diameter of the 'top' unsealed opening of the via to the 'bottom' sealed opening is closer to unity than the conventional solely single-sided etch described above with respect to FIGS. 1A-1C, further providing, in part, the improved via shape as compared to the conventional solely single-sided etch described above with respect to FIGS. 1A-1C. Further still, application of the DSOP followed by the SSOP provides greater control over the diameter of the 'top' opening of the via at least by making the diameter of the 'top' opening less dependent on the thickness of the substrate, allowing the option for a reduced diameter of the 'top' opening of the via and greater via density in the substrate as compared to the conventional solely single-sided etch via formation process above with respect to FIGS. 1A-1C.

Further, the inventive SSOP can be applied for a shorter duration than the conventional solely single-sided etch described above with respect to FIGS. 1A-1C, since the DSOP provides initial openings at both ends of the via, and therefore, the SSOP is not necessarily responsible for having to etch all the way through the substrate and then to enlarge the farther end of the via, as in the conventional solely single-sided etch described above with respect to FIGS. 1A-1C. The etch chemistry of the SSOP can be adjusted relative to that of the DSOP, according to various embodiments, to change the etch rate of the portion of the via near the "bottom" or blocked substrate surface relative to that at the top, exposed surface, and thus shape the via advantageously. In the DSOP followed by SSOP process, according to some embodiments, it may be desired that the DSOP utilize etch conditions that have a constant etch rate along the length of the via, while the SSOP may utilize etch conditions which act predominantly on the top opening of the via. In the conventional solely single-sided etch described above, it would be desired that the etch conditions have the most constant etch rate along the length of the via in order to minimize the size of the via opening in the top surface, which is opposite to the etch conditions selected for the SSOP etch in various embodiments of the present invention. Since the inventive SSOP can be applied for a relatively shorter duration, the presence of undercutting or lateral etching at the interface between the bottom sealed surface of the substrate and the seal is reduced, which provides, at least in part, the improved via shape as compared to the conventional solely single-sided etch described above with respect to FIGS. 1A-1C. It should be noted that the invention is not limited to these or any other examples or embodiments provided herein, which are referred to for purposes of illustration only.

In the descriptions herein, certain specific details are set forth in order to provide a thorough understanding of various embodiments of the invention. However, one skilled in the art will understand that the invention may be practiced at a more general level without one or more of these details. In other instances, well-known structures have not been shown or described in detail to avoid unnecessarily obscuring descriptions of various embodiments of the invention.

Any reference throughout this specification to "one embodiment", "an embodiment", "an example embodiment", "an illustrated embodiment", "a particular embodiment", and the like means that a particular feature, structure or characteristic described in connection with the embodiment is included in at least one embodiment. Thus, any appearance of the phrase "in one embodiment", "in an embodiment", "in an example embodiment", "in this illustrated embodiment", "in this particular embodiment", or the like in this specification is not necessarily all referring to one embodiment or a same embodiment. Furthermore, the particular features, structures or characteristics of different embodiments may be combined in any suitable manner to form one or more other embodiments.

Unless otherwise explicitly noted or required by context, the word "or" is used in this disclosure in a non-exclusive sense. In addition, unless otherwise explicitly noted or required by context, the word "set" is intended to mean one or more. For example, the phrase, "a set of objects" means one or more of the objects.

Further, the phrase "at least" is or may be used herein at times merely to emphasize the possibility that other elements may exist besides those explicitly listed. However, unless otherwise explicitly noted (such as by the use of the term "only") or required by context, non-usage herein of the phrase "at least" nonetheless includes the possibility that other elements may exist besides those explicitly listed. For example, the phrase, 'based at least on A' includes A as well as the possibility of one or more other additional elements besides A. In the same manner, the phrase, 'based on A' includes A, as well as the possibility of one or more other additional elements besides A. However, the phrase, 'based only on A' includes only A. Similarly, the phrase 'configured at least to A' includes a configuration to perform A, as well as the possibility of one or more other additional actions besides A. In the same manner, the phrase 'configured to A' includes a configuration to perform A, as well as the possibility of one or more other additional actions besides A. However, the phrase, 'configured only to A' means a configuration to perform only A.

Further, the phrase "in response to" may be used in this disclosure. For example, this phrase may be used in the following context, where an event A occurs in response to the occurrence of an event B. In this regard, such phrase includes, for example, that at least the occurrence of the event B causes or triggers the event A.

Figure 2:
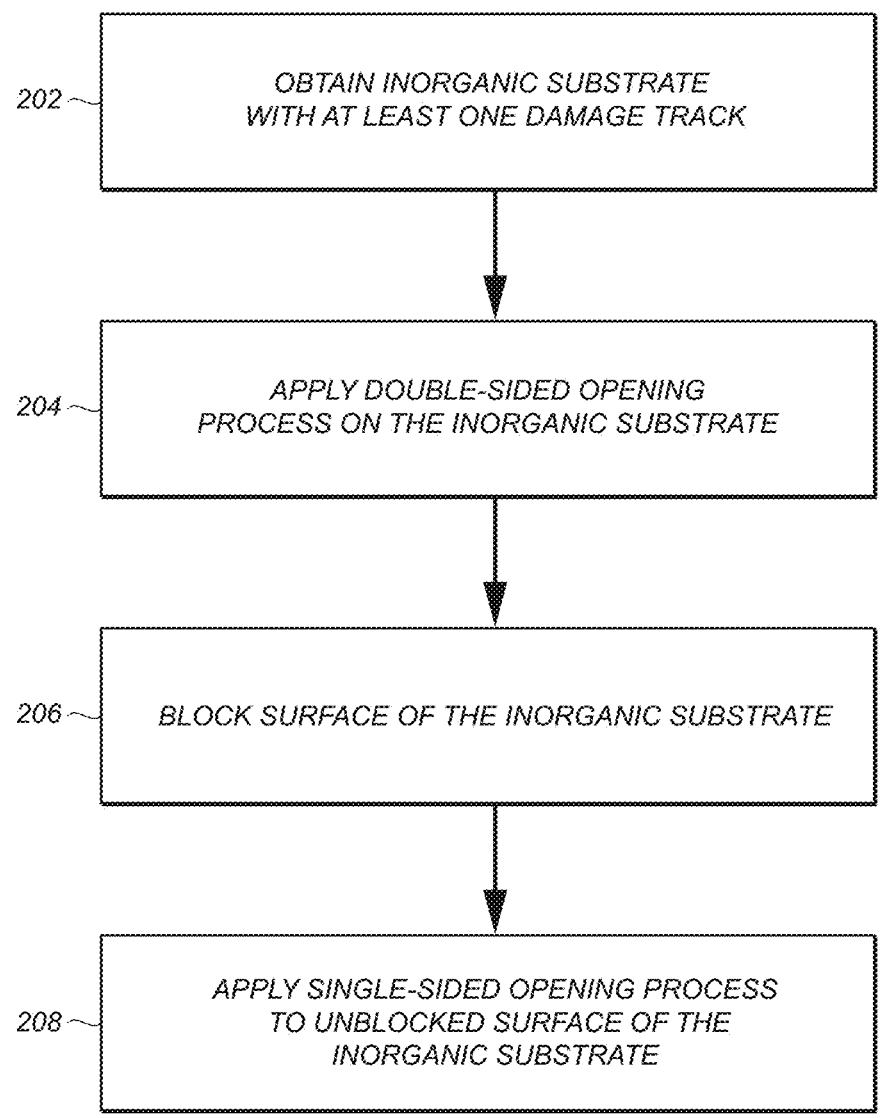
FIG. 2 illustrates methods of facilitating formation of a via in a substrate, according to some embodiments of the present invention.

FIG. 2 illustrates methods of facilitating formation of a via in a substrate, according to some embodiments of the present invention. Although FIG. 2 includes four blocks, block 202, block 204, block 206, and block 208 in an illustrated sequence, each block corresponding to respective actions, various embodiments of the present invention include a subset (one or more) of such blocks in same or different sequences (when more than two blocks are included). It should be noted that each block in FIG. 2 may be considered a method step, according to some embodiments. Further, various embodiments of the present invention are not limited to one, or more, or all of the actions shown in the blocks of FIG. 2, and some embodiments of the present invention include other actions described herein not shown in FIG. 2 in addition to or in lieu of the actions shown in FIG. 2. In this regard, FIG. 2 is provided merely for illustration purposes and is not limiting.

Referring to the process flow chart in FIG. 2, block 202 may include, according to some embodiments, obtaining an inorganic substrate, such as glass, including damage or pilot tracks (or pilot holes) at specified locations through the substrate where vias are desired. (For ease of discussion going forward, the phrase "damage track" will be intended to include a damage track, a pilot track, or a pilot hole, according to various respective embodiments).

Figure 3:
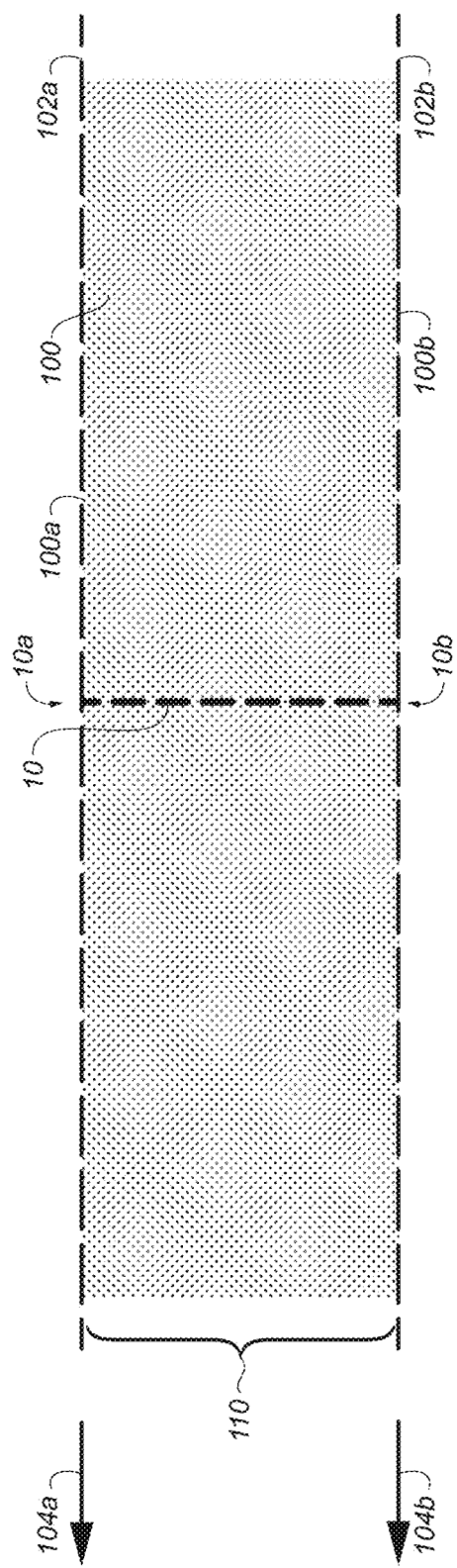
FIG. 3 illustrates an example of a substrate including a damage or pilot track with reference to block 202 in FIG. 2, according to some embodiments of the present invention.

FIG. 3 illustrates a damage track 10 (illustrated in bold broken line) proceeding all the way through the thickness 110 of an inorganic substrate 100, according to some embodiments. The inorganic substrate 100 may be any inorganic material, useful for semiconductor, photonic, electronic or photonic packaging, that allows the formation of a damage track, according to some embodiments. Inorganic substrates may include, but are not limited to, glass, fused silica, synthetic quartz, glass ceramic, ceramic, aluminum oxides, crystalline material, such as sapphire, or laminated layers of such materials (for example, coated glass.) Silicon dioxide ($SiO_2$)-based materials may be particularly suitable in some contexts. $SiO_2$ as an amorphous material that can be suitably disrupted by laser energy and is particularly well suited to some embodiments of the present invention since application of laser energy leads to damage regions that have a substantially higher etch rate than neighboring undamaged regions. Furthermore, $SiO_2$ can be etched with wet processes that exploit this difference between damaged and undamaged regions which provides very well controlled etch rates that retain a very high degree of surface smoothness. $SiO_2$ may be pure, commonly referred to as fused silica or fused quartz, or may contain other components including but not limited to Al, Ca, B, and Mg, according to some embodiments. The inorganic substrate thickness 110 may be any value, but preferably under 500 micrometers in some embodiments, and more preferably in some embodiments, between 300 micrometers and 10 micrometers, or under 200 micrometers in some embodiments. In some embodiments, such thickness values or ranges of the inorganic substrate 100 are satisfied at least (e.g., immediately) prior to (a) applying the double-sided opening process discussed in more detail below with respect to block 204 in FIG. 2, (b) applying the single-sided opening process discussed in more detail below with respect to block 208 in FIG. 2, or both (a) and (b). The inorganic substrate 100 may be in the form of a wafer, or in the form of a panel. The dimensions of the inorganic substrate 100 may conform to the standard sizes used for semiconductor wafers, or may be different. The inorganic substrate 100, if in the form of a wafer, may comprise the flats or notches typical for semiconductor wafers, or be perfectly round. The inorganic substrate 100, if in the form of a glass panel, may be any desired size up to the width practical for forming the glass.

Referring again to FIG. 3, the inorganic substrate 100 includes a first surface 100a and a second surface 100b on an opposite side of the inorganic substrate 100 than the first surface 100a. In some embodiments, the first surface 100a resides or substantially resides within a first plane 102a (illustrated in fine broken line in FIG. 3), and the second surface 100b resides or substantially resides within a second plane 102b (illustrated in fine broken line in FIG. 3). In some embodiments, the first surface 100a extends in any of multiple directions within the first plane 102a, although only a single extension direction 104a of the first surface 100a is shown, for example, in FIG. 3. In some embodiments, the second surface 100b extends in any of multiple directions within the second plane 102b, although only a single extension direction 104b of the second surface 100b is shown, for example, in FIG. 3. In some embodiments, each of the first surface 100a and the second surface 100b has a root mean square ("RMS") surface roughness less than 10 nm, according to some embodiments, and preferably less than 1 nm, according to some embodiments. Inorganic substrates may be made by several processes, according to some embodiments, including fusion processes, melt-grown processes and crystal-growth processes. Although the inorganic substrate 100 shown, for example, by FIG. 3 contains a single damage track 10 at a specific desired location of a via in the inorganic substrate 100, typically, the inorganic substrate 100 will contain a plurality of damage tracks through the thickness of the substrate, at desired via locations. A damage track, including the damage track 10, may be produced by any suitable process, such as the application of high-energy particles or a laser drilling process. For reasons of high through-put, each damage-track may be produced by a laser designed to create a large number of damage tracks in the inorganic substrate 100. Each damage track may be created with a single laser shot. Alternatively, each laser damage track may be produced with a plurality of laser pulses that are directed at the same region of the substrate. According to some embodiments, a preferred process in some contexts is a laser process that produces well-formed damage tracks, without producing cracks in the surrounding inorganic substrate material. In some embodiments, particularly preferable processes are those that use a short laser pulse (e.g., from 0.1 nanosecond (1e-10) to 1 femtosecond (1e-15)) with an optical system that creates a line focus system to form damage tracks through the inorganic substrate 100. A damage track, according to some embodiments, is assumed to be produced in a line through the entire thickness 110 of the inorganic substrate 100. In some embodiments, the damage track 10 may be a small (diameter less than or equal to 1 micrometer) hole through the inorganic substrate 100. In other embodiments, the damage track 10 may have portions of its length that are open, but portions that are filled with substrate material with a modified atomic arrangement relative to the bulk of the substrate.

Referring back to FIG. 2, block 204 in the flow-chart describes that a double-sided opening process ("DSOP") is applied simultaneously to both surface 100a and surface 100b of the inorganic substrate 100 to produce or increase the size of openings at the ends of the damage track 10 and to form, or increase the internal diameter (taken perpendicular to the thickness 110) of, a pathway along the damage track 10 in the inorganic substrate 100. In some embodiments, the DSOP produces a via through the inorganic substrate 100 from the damage track 10. In some embodiments, the DSOP may include submerging the inorganic substrate 100 containing the damage track 10 in a wet etch solution, which can either be an acidic solution or a basic solution. In this regard, the DSOP may include a wet etching process concurrently applied to the first surface 100a of the inorganic substrate 100 and the second surface 100b of the inorganic substrate 100.

Figure 4:
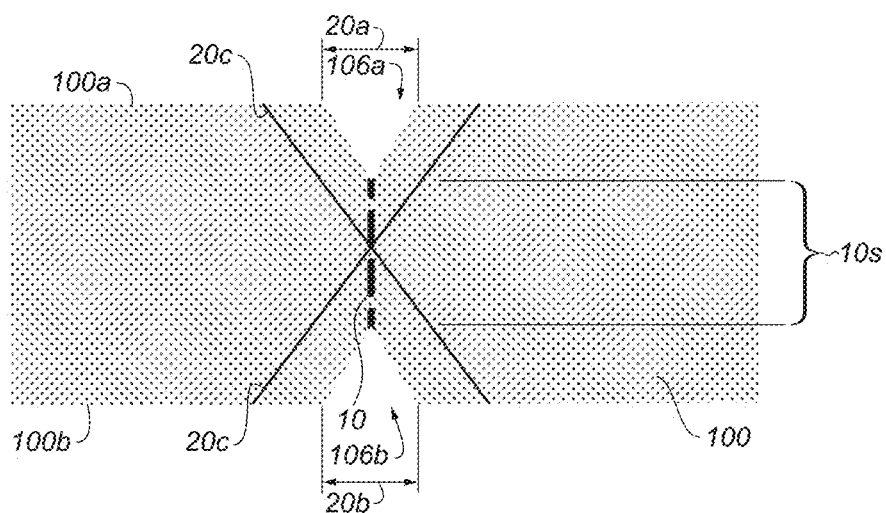
FIGS. 4 and 5 illustrate an example of a first via-formation state of at least a portion of a substrate subjected to a double-sided opening process with reference to block 204 in FIG. 2, according to some embodiments of the present invention.
Figure 5:
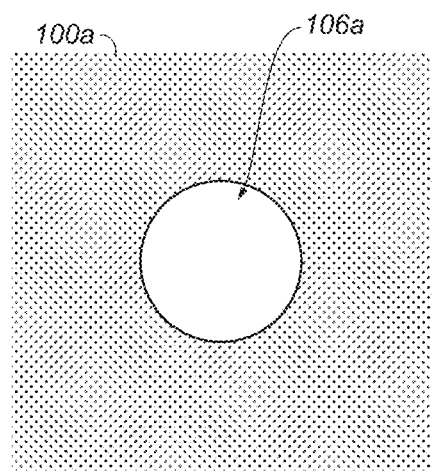

FIGS. 4 and 5 illustrate an example of a first via-formation state of the inorganic substrate 100 subjected to the DSOP according to some embodiments of block 204 in FIG. 2. In some embodiments, the first via-formation state is an interim via-formation state at a time during but before completion of the DSOP, according to some embodiments. In some embodiments, the wet etch of the DSOP is isotropic and causes, as illustrated by a comparison of FIGS. 3 and 4, the diameter of an opening at each end of the damage track 10 to grow as the etch depth increases along the line of the damage track 10. In the first via-formation state of FIG. 4, an opening 106a in the first surface 100a and an opening 106b in the second surface 100b has grown compared to the state of FIG. 3. In FIG. 4, the lines 20c serve as guides to the eye for generally how the openings at the surfaces 100a, 100b become larger as the duration of the wet etch for the DSOP increases along the damage track 10, the length of which becomes reduced with increased duration of the wet etch (to a length 10s in the first via-formation state of FIG. 4). Referring to FIG. 5, a top-down view of the opening 106a is illustrated, showing its circular shape. The opening 106b has the same or a similar circular shape. Although FIG. 5 illustrates a perfect circle for example purposes, it is to be understood that variations and imperfections would likely exist.

Figure 6A:
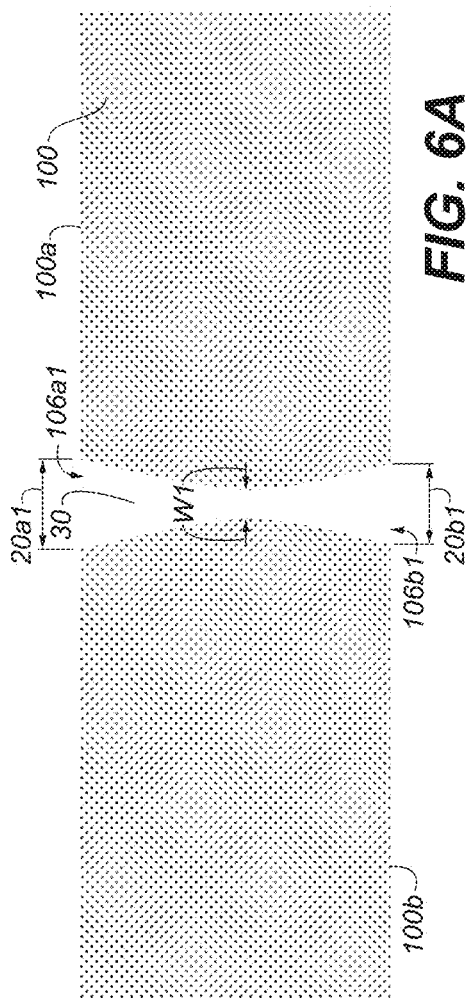
FIGS. 6A-6C illustrate examples of subsequent via-formation states subsequent to the first state of FIGS. 4 and 5 of a substrate subjected to a double-sided opening process with reference to block 204 in FIG. 2, according to some embodiments of the present invention.
Figure 6B:
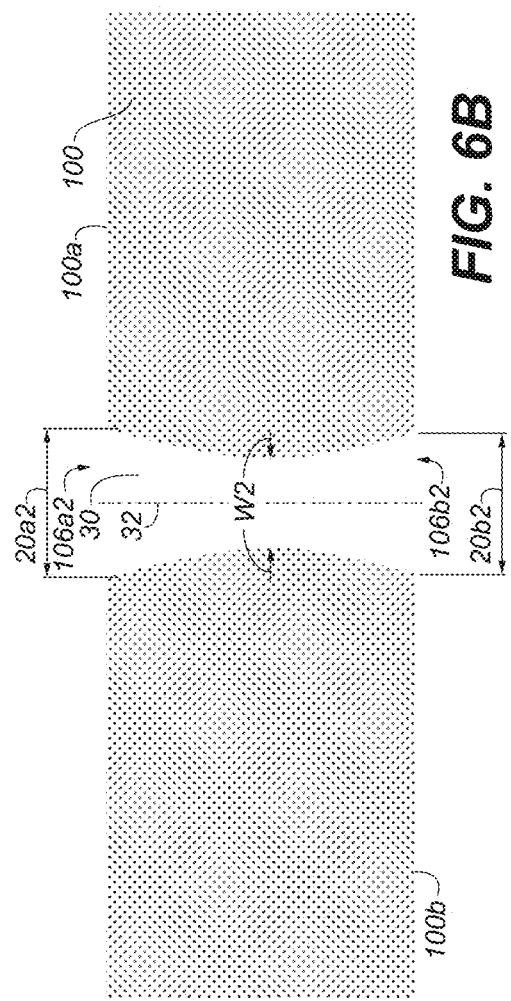
Figure 6C:
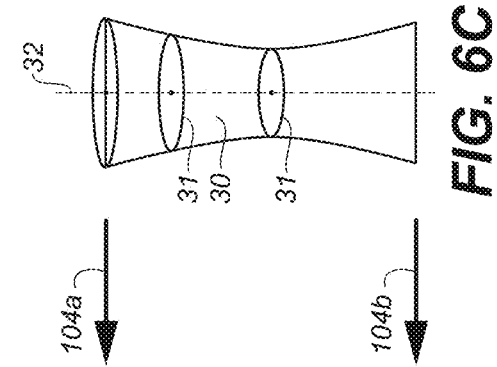

FIGS. 6A-6C illustrate examples of via-formation states subsequent to the first state of FIGS. 4 and 5 of the inorganic substrate 100 subjected to the DSOP described with reference to block 204 in FIG. 2, according to some embodiments of the present invention. For example, if the wet etching included in the DSOP described above with respect to FIGS. 4 and 5 is continued long enough, it results in a via or pathway 30 with an hourglass or hourglass-like profile as illustrated in FIGS. 6A and 6B, and as illustrated three dimensionally in FIG. 6C. Referring to FIG. 6C, a longitudinal axis 32 of the via or pathway 30 can be said to run through the substrate 100 where the damage track 10 was originally positioned, according to some embodiments. The longitudinal axis 32 may be perpendicular to (a) an extension direction (e.g., at least extension direction 104a) of the first surface 100a of the inorganic substrate 100, (b) an extension direction (e.g., at least extension direction 104b) of the second surface 100b of the inorganic substrate 100, or both (a) and (b). In this regard, in some embodiments, the longitudinal axis 32 may be perpendicular to (i) the first plane 102a in which the first surface 100a of the inorganic substrate 100 resides or substantially resides, (ii) the second plane 102b in which the second surface 100b of the inorganic substrate 100 resides or substantially resides, or both (i) and (ii). In some embodiments, the longitudinal axis 32 bisects a width of the via or pathway (e.g., via or pathway 30 or resultant via or pathway 30a discussed in more detail below) at least at one or both of the openings of the via or pathway in the first surface 100a and second surface 100b of the inorganic substrate 100. In some embodiments, the longitudinal axis 32 proceeds through a center of a lateral cross section of either or both of the openings (e.g., openings 106a2, 106b2 in the example of FIG. 6B) in surfaces 100a, 100b, the lateral cross section(s) residing within the plane(s) (e.g., first plane 102a, second plane 102b, or both) of the respective opening(s). At different positions along the longitudinal axis 32 (e.g., which may be considered to be along a length of the via or pathway 30 in some embodiments) within the via or pathway 30, the cross-sectional diameter of the via or pathway 30 will vary. In this regard, the varying cross-sectional diameters of the via or pathway 30 may be considered varying diameters of lateral cross-sections of the via or pathway 30, the lateral cross-sections (e.g., lateral cross-sections 31 in FIG. 6C) taken perpendicular to the longitudinal axis 32 of the via or pathway 30, or taken perpendicular to the first plane 102a, the second plane 102b, or both the first plane 102a and the second plane 102b, or taken perpendicular to an extension direction (e.g., at least extension direction 104a) of the first surface 100a of the inorganic substrate 100, an extension direction (e.g., at least extension direction 104b) of the second surface 100b of the inorganic substrate 100, or both an extension direction (e.g., at least extension direction 104a) of the first surface 100a of the inorganic substrate 100 and an extension direction (e.g., at least extension direction 104b) of the second surface 100b of the inorganic substrate 100.

In some embodiments, the via-formation state represented by FIG. 6A is a state of the via or pathway 30 upon conclusion or after completion of the DSOP. In some embodiments, the via-formation state represented by FIG. 6B is a state of the via or pathway 30 upon conclusion of the DSOP. Accordingly, depending on the desired three-dimensional shape of the via or pathway 30, the DSOP may be concluded at different times, e.g., such that an earlier conclusion of the DSOP (e.g., earlier than the state of FIG. 6B) may result in a via or pathway 30 in the state of FIG. 6A, and a later conclusion of the DSOP (e.g., later than the state of FIG. 6A) may result in a via or pathway 30 in the state of FIG. 6B, which illustrates a larger via or pathway 30 compared to FIG. 6A, due to the longer wet etching process associated with FIG. 6B, according to some embodiments.

FIG. 6A illustrates a via or pathway 30 produced by at least part of the DSOP, the via or pathway 30 including a first opening 106a1 having a diameter 20a1 at surface 100a, and a first opening 106b1 having a diameter 20b1 at surface 100b, which is equal or substantially equal to diameter 20a1 of the first opening 106a1 at surface 100a, according to some embodiments. The smallest cross-sectional diameter W1 of the via or pathway 30, located inside the inorganic substrate 100, may be referred to as the waist of the via or pathway 30. In the example of FIG. 6A, the waist W1 is smaller than the diameter 20a1 of the opening 106a1 at surface 100a and is smaller than the diameter 20b1 of the opening 106b1 at surface 100a. However, in some embodiments, such as those described in more detail below with respect to FIGS. 7B and 7C, the diameter of the waist of the via or pathway 30a may be smaller than the diameter of the opening of the via or pathway 30a at surface 100a and may be smaller than or equal to the diameter of the opening of the via or pathway at surface 100b. Further, although a comparison of diameters is provided in the above examples to determine a location of the waist, other internal dimensions of the via or pathway 30 may be used to determine the location of the waist of the via or pathway, according to some embodiments. For example, the waist of the via or pathway 30 may be determined as the location along the longitudinal axis 32 of the via or pathway 30 having the smallest lateral two-dimensional cross-sectional area, according to some embodiments. In instances where diameters are used to determine the location of the waist, all diameters may be required to extend in the same directions or reside within a same plane taken along the longitudinal axis 32 (e.g., a profile of the via or pathway 30 that is perpendicular to the lateral cross-sections of the via or pathway 30), according to some embodiments. In some embodiments, where several diameters or lateral cross-sectional areas or other compared dimension of the via or pathway 30 have a same minimum value, the waist may be determined to be located at the point along the longitudinal axis 32 where the dimension first reaches that minimum value, when proceeding along the longitudinal axis 32 from the first surface 100a toward the second surface 100b, according to some embodiments. Alternatively, in some embodiments, where several diameters or lateral cross-sectional areas or other compared dimension of the via or pathway 30 have a same minimum value, the waist may be determined to be located at the point along the longitudinal axis 32 where the dimension first reaches that minimum value, when proceeding along the longitudinal axis 32 from the second surface 100b toward the first surface 100a, according to some embodiments.

As discussed above, when comparing FIG. 6A to FIG. 6B, further etching will continue to enlarge the openings, expanding first opening 106a1 to first opening 106a2, and expanding first opening 106b1 to first opening 106b2, and may also change the ratio of the waist dimension to the dimension of either of the first openings in the first surface 100a and second surface 100b, respectively. In this regard, the ratio between a dimension of the waist and a dimension of either of the openings of the via or pathway 30 at the two surfaces 100a, 100b is determined by details of the etchant solution composition, conditions of the etch bath, including agitation and temperature, and time in the solution.

In some embodiments, the DSOP produces a via opening at surface 100a (at each of the states of FIGS. 4, 6A, and 6B) that is symmetrical or substantially symmetrical to the opening produced at surface 100b, according to some embodiments. The DSOP produces a via opening (e.g., opening 106a, opening 106b, opening 106a1 (FIG. 6A), opening 106b1 (FIG. 6A), opening 106a2 (FIG. 6B), or opening 106b2 (FIG. 6B)) and an internal via diameter that is smooth and without cracks, and preferably circular, according to some embodiments, as shown, e.g., with FIGS. 5 and 6C. According to some embodiments, circular means the various diameters of the opening (e.g., opening 106a, opening 106b, opening 106a1 (FIG. 6A), opening 106b1 (FIG. 6A), opening 106a2 (FIG. 6B), or opening 106b2 (FIG. 6B)) or a lateral cross-section of an internal region of the via or pathway 30 measure substantially the same value regardless of the orientation of the diameter measurement in the respective plane (e.g., plane 102a or plane 102b, respectively in the case of the openings at surfaces 100a, 100b, or within the plane of the respective lateral-cross section of an internal portion of the via or pathway 30), according to some embodiments. The circularity of each opening or lateral cross-section of the via or pathway 30 may be characterized by the ratio of the minimum diameter to the maximum diameter of the opening or lateral cross-section as measured in a large number of possible diameter-measurement orientations. A circularity of greater than 0.8 is preferred, according to some embodiments. Alternatively, openings or lateral cross-sections in vias or pathways that are intentionally non-circular, with a circularity below 0.8, may be useful for certain applications. Typical sizes of the diameter of an opening in a via or pathway are less than or equal to 50 micrometers, and more preferably less than or equal to 30 micrometers, according to various embodiments. In some cases, smaller internal lateral cross-sectional diameters of vias or pathways are preferred, with via diameter less than or equal to 10 micrometers, according to some embodiments.

In light of the above-discussion, according to some embodiments, a method of facilitating formation of a via in an inorganic substrate may include (e.g., according to block 204 in FIG. 2), applying the DSOP to the inorganic substrate 100, the inorganic substrate 100 including a damage track 10 having a first end 10a in a first surface 100a of the inorganic substrate 100 and a second end 10b in a second surface 100b of the inorganic substrate 100. The second surface 100b is on an opposite side of the inorganic substrate 100 than the first surface 100a of the inorganic substrate 100. The DSOP may enlarge at least a first dimension (e.g., a size, diameter, or area of lateral cross-section) of the first end 10a of the damage track 10 to form a first opening (e.g., first opening 20a2) in the first surface 100a of the inorganic substrate 100. The first dimension of the first end 10a of the damage track 10 may be measured within a plane (e.g., plane 102a) of the first surface 100a of the inorganic substrate 100. The DSOP may enlarge at least a first dimension (e.g., a size, diameter, or area of lateral cross-section) of the second end 10b of the damage track 10 to form a first opening (e.g., first opening 106b2) in the second surface 100b of the inorganic substrate 100. The first dimension of the second end 10b of the damage track 10 may be measured within a plane (e.g., plane 102b) of the second surface 100b of the inorganic substrate 100. The DSOP produces a via or pathway 30 extending between the first opening (e.g., first opening 106a2) in the first surface 100a of the inorganic substrate 100 and the first opening (e.g., first opening 106b2) in the second surface 100b of the inorganic substrate 100. The via or pathway 30 may include a longitudinal axis 32 perpendicular to (a) an extension direction (e.g., extension direction 104a) of the first surface 100a of the inorganic substrate 100, (b) an extension direction (e.g., extension direction 104b) of the second surface 100b of the inorganic substrate 100, or both (a) and (b). The via or pathway 30 may include varying diameters of lateral cross-sections (e.g., cross-sections 31) taken perpendicular to the longitudinal axis 32 of the via or pathway 30, according to some embodiments. In some embodiments, the pathway includes a waist coinciding with a lateral cross-section of the via or pathway 30 taken perpendicular to the longitudinal axis 32 at a point of minimum diameter of the varying diameters of the pathway According to various embodiments, the DSOP may be any process that etches or removes portions of the inorganic substrate 100 preferentially in the location of the damage track 10 from both sides of the inorganic substrate 100 so as to enlarge the damage track 10 to form a partial or fully formed via (e.g., akin to FIGS. 4, 6A, and 6B, depending on desired via shaping, according to some embodiments). The DSOP may include etching with reactive gases in a configuration that gives access to both surfaces 100a, 100b, and immersive wet processes involving acidic or basic solutions. Immersive wet processes may be preferred in various contexts. An immersive double-sided opening process performed in a tank may be particularly suitable in various contexts. The immersive wet process may also include agitation of the solution in the tank. Agitation may include fluid flow, application of ultrasonic energy in the range of 30 kHz to approximately 1 MHz, or application of so called megasonic mixing involving the application of frequencies near and above 1 MHz. Etching may be accomplished with solutions of hydroxides, including but not limited to potassium hydroxide, sodium hydroxide, and tetramethylammonium hydroxide at temperatures above 50° C., preferably above 75° C. For many materials, including $SiO_2$-containing materials, solutions containing hydrogen fluoride (HF) may be preferable. Solution compositions including HF at concentrations from 0.1 to 10M may be preferable, and may include additional components to lower or raise pH. The additional components may include, but are not limited to, hydrochloric acid, nitric acid, and ammonium fluoride, according to various embodiments. Additional components may include surfactants. Temperature of the tank may be as cold as −10° C. or up to 60° C., with a range between 0° C. and 50° C. being preferable in some contexts.

Additives that modify the shape of the via formed during the DSOP may be used. In some embodiments, additives that promote the formation of a via with a waist diameter that is closest to the diameter of the top opening or bottom opening may be used. In other words, additives that produce a via shape with the minimum variation of via diameter across the thickness of the substrate, or produce a via with a shape closest to cylindrical, may be used. Such additives may include any additives that reduce the surface etch rate of a particular etchant, while minimally affecting the diffusion rates of the etchant, may be used, according to some embodiments.

Multicomponent glasses such as borosilicate or aluminoborosilicate glass contain components such as calcium and magnesium that tend to precipitate upon etching with HF. This precipitation may lead to non-uniform etch and fouling of the etching vessels. Certain etchant formulations prevent significant precipitation, generally by providing lower hydrofluoric concentration and higher concentrations of a strong acid. A strong acid may be any acid with an acid dissociation constant, pKa, of less than 2, preferably less than 1 in some contexts, including but no limited to hydrochloric, nitric, or sulfuric acid. Preferred etching solutions may contain an HF concentration less than between 0.1 and 1M and a strong acid concentration greater than 0.8M and less than 10M, preferably less than 5M in some contexts. Particularly preferred etching compositions may contain an HF concentration below 0.6M and a strong acid concentration above 1M.

In some embodiments, the DSOP need not produce a complete via opening that progresses all the way through the inorganic substrate 100, as shown, e.g., by the state of FIG. 4, where the opening 106a and the opening 106b exist, but a region of the damage track 10 corresponding to length 10s in FIG. 4 exists between the openings 106a, 106b. In some embodiments where the DSOP completes in the via-formation state of FIG. 4, it may be considered that a pathway extends from or between the opening 106a (an example of a first opening in the first surface 100a of the inorganic substrate 100 in this example) to or and the opening 106b (an example of a first opening in the second surface 100b of the substrate 100 in this example), such that the pathway includes the remaining portion of the damage track 10 corresponding to length 10s. In at least some of these instances, the progression of the complete via opening through the entirety of the inorganic substrate 100 may be completed by a single-sided opening process, discussed in more detail below with respect to at least block 208 in FIG. 2. In some embodiments where the DSOP completes in the via-formation state of FIG. 4, the DSOP enlarges at least a first dimension of at least a first end 10a or first end portion of the damage track 10 extending from the first surface 100a of the inorganic substrate 100 to form a first opening (e.g., first opening 106a in this example) in the first surface 100a of the inorganic substrate 100, and the DSOP enlarges at least a first dimension of at least a second end 10b or second end portion of the damage track 10 extending from the second surface 100b of the inorganic substrate 100 to form a first opening (e.g., first opening 106b in this example) in the second surface 100b of the inorganic substrate 100. As the enlargement of each opening increases, the depth of the opening on each side moves closer to the center of the inorganic substrate 100 along damage track 10. Referring to FIG. 6, as the double-sided opening process continues, if desired, the opening regions eventually connect, causing the via or pathway 30 to include an open channel extending all the way through the inorganic substrate 100. In each of at least FIGS. 4, 6A, and 6B, the via or pathway extends from the first opening (e.g., opening 106a, opening 106a1, or opening 106a2) in the first surface 100a of the inorganic substrate 100 to or at least toward the first opening (e.g., opening 106b, opening 106b1, or opening 106b2) in the second surface 100b of the inorganic substrate 100, the via or pathway (e.g., via or pathway 30) including a longitudinal axis 32 (e.g., FIG. 6C), e.g., perpendicular to an extension direction (e.g., at least extension direction 104a) of the first surface 100a of the inorganic substrate 100 and, e.g., perpendicular to an extension direction (e.g., at least extension direction 104b) of the second surface 100b of the inorganic substrate 100, according to some embodiments.

According to some embodiments, the DSOP yields a diameter (e.g., diameter 20a in FIG. 4, diameter 20a1 in FIG. 6A, or diameter 20a2 in FIG. 6B) of the first opening (e.g., first opening 106a in FIG. 4, first opening 106a1 in FIG. 6A, or first opening 106a2 in FIG. 6B) in the first surface 100a of the inorganic substrate 100 and a diameter (e.g., diameter 20b in FIG. 4, first diameter 20b1 in FIG. 6A, or first diameter 20b2 in FIG. 6B) of the first opening (e.g., first opening 106b in FIG. 4, first opening 106b1 in FIG. 6A, or first opening 106b2 in FIG. 6B) in the second surface 100b of the inorganic substrate 100. The above diameters may be of the same or similar dimensions since etching of both surfaces 100a and 100b may occur in the same process, according to some embodiments. Slight variations in conditions may exist on either side of the inorganic substrate 100 leading to slightly different diameters of the openings on the first surface 100a and the second surface 100b, and, therefore, a ratio of the two diameters may be considered. In this regard, in some embodiments, a ratio of (a) a diameter (e.g., diameter 20a in FIG. 4, diameter 20a1 in FIG. 6A, or diameter 20a2 in FIG. 6B) of the first opening (e.g., first opening 106a in FIG. 4, first opening 106a1 in FIG. 6A, or first opening 106a2 in FIG. 6B) in the first surface 100a of the inorganic substrate 100 to (b) a diameter (e.g., diameter 20b in FIG. 4, diameter 20b1 in FIG. 6A, or diameter 20b2 in FIG. 6B) of the first opening (e.g., first opening 106b in FIG. 4, first opening 106b1 in FIG. 6A, or first opening 106b2 in FIG. 6B) in the second surface 100b of the inorganic substrate 100 is between 0.7 and 1.3, in some embodiments, and between 0.8 and 1.2 in some embodiments, the diameter of the opening in the first surface 100a of the inorganic substrate 100 and the diameter of the first opening in the second surface 100b of the inorganic substrate 100 being measured along parallel line segments, according to some embodiments.

In some embodiments, it may be advantageous to apply the DSOP to thin substrates. When glass substrates are formed sufficiently thin, less than 0.3 mm for example, it can be difficult to handle free-standing, for instance, for processes following the DSOP, that are intended to fill the through-glass vias with electrically conductive material. However, if a thin substrate containing a through-glass via with an hour-glass profile is mounted on a support to allow it to be handled more easily, such as a polymer film or an inorganic carrier substrate, the profile resulting from the DSOP may become a problem for fully filling the through-glass via with conductive material. The hour-glass profile with one end blocked contains portions that are re-entrant when considered from the open end. For example, a line-of-sight deposition of a seed layer prior to electroplating may not give rise to a continuous seed film within the through-glass via. This can result in incomplete filling in the electroplating process.

The via or pathway 30 may include varying diameters of lateral cross-sections taken perpendicular to the longitudinal axis 32 of the via or pathway 30, the via or pathway 30 including a waist (e.g., waist W1 in FIG. 6A, waist W2 in FIG. 6B, or, in some embodiments, a waist may be considered to be located in FIG. 4 at the end of length 10s of damage track 10 closest to first surface 100a of inorganic substrate 100) coinciding with a lateral cross-section of the via or pathway 30 taken perpendicular to the longitudinal axis 32 at a point of minimum diameter of the varying diameters of the via or pathway 30. Or, in some embodiments, the waist may be considered to be the region of the length 10s of the damage track 10 of minimum diameter. Depending on the length of the etch time and details of the etch method including agitation, etching solution composition, and tank temperature, the shape of the via or pathway 30 can change with respect to opening the diameters of the respective openings in surfaces 100a, 100b, and with respect to at least the ratio of the waist of the via or opening 30 to those opening diameters. In some embodiments of the present invention, the etch is allowed to proceed until the 'top' (surface 100a) and 'bottom' (surface 100b) opening diameters, which are generally comparable, have enlarged to within 30%, or more preferably in some contexts within 20%, or more preferably still in some contexts within 10% of the desired final opening size of the via or pathway 30 at surface 100b, according to some embodiments.

In this regard, in some embodiments, a diameter (e.g., diameter 20b in FIG. 4, diameter 20b1 in FIG. 6A, or diameter 20b2 in FIG. 6B) of the first opening (e.g., first opening 106b in FIG. 4, first opening 106b1 in FIG. 6A, or first opening 106b2 in FIG. 6B) in the second surface 100b of the inorganic substrate 100 is within 20% in some embodiments, or within 10% in some embodiments, of a corresponding diameter (e.g., diameter 20b3 in FIG. 7A, diameter 20b4 in FIG. 7B, or diameter 20b5 in FIG. 7C) of the second opening (e.g., second opening 106b3 in FIG. 7A, opening 106b4 in FIG. 7B, or opening 106b5 in FIG. 7C) in the second surface 100b of the inorganic substrate 100, the diameter of the first opening in the second surface 100b of the inorganic substrate 100 and the corresponding diameter of the second opening in the second surface 100b of the inorganic substrate 100 are measured along parallel line segments.

Upon completion of the DSOP, and before the application of the single-sided opening process discussed in more detail below, the waist position, because of the symmetry of the DSOP, is at or substantially at the center of the substrate (along its thickness dimension) as measured along the longitudinal axis 32, according to some embodiments.

The ratio of the waist diameter to the diameter of either of the opening diameters of the openings in surfaces 100a, 100b of the via or pathway 30 is less than 1, according to some embodiments, indicating that the waist diameter is smaller than the opening diameters. Thus, the conical shape proceeding from the resulting openings in surfaces 100a, 100b, according to some embodiments, may have smaller diameters occurring at some point along the longitudinal axis 32 than the diameters of either of the openings at their respective surfaces 100a, 100b. The resulting shape of the via or pathway 30 upon completion of the DSOP (but before application of the single-sided opening process discussed below) may be an hourglass shape, e.g., as shown in FIG. 6A and FIG. 6B, according to some embodiments. It may be preferred that the ratio of the waist diameter to the opening diameters upon completion of the DSOP be greater than 0.5, or preferably greater than 0.7, according to various embodiments. The position of the waist of the via or pathway 30 may occur at any point between the first surface 100a and the second surface 100b, according to various embodiments. Generally, the waist occurs near the midpoint of the inorganic substrate 100 between the first surface 100a and the second surface 100b upon conclusion of the DSOP. In this regard, it should be noted that, although the discussions herein commonly refer to consistent references for the first surface 100a, the second surface 100b, and the thickness 110 of the inorganic substrate 100 for purposes of clarity and ease of explanation, the first surface 100a, the second surface 100b, and the thickness 110 change during the DSOP or any process that etches away at the substrate, as etching may reduce the thickness of the inorganic substrate 100 as a function of the duration of the application of the etch. Accordingly, when reference is made to a midpoint of the thickness and the like of the inorganic substrate 100, such a midpoint and the like may be determined according to the thickness of the inorganic substrate 100 existing at the time of midpoint measurement, according to some embodiments. In this regard, according to some embodiments, the waist of the via or pathway 30 may exist between 30% and 70% of the distance between the first surface 100a and the second surface 100b. The waist preferably may exist between 40% and 60% of the distance between the first surface 100a and the second surface 100b, according to some embodiments.

Referring now to FIG. 2, block 206, after completion of the DSOP, surface 100b of the inorganic substrate 100 may be protected, sealed, or blocked, in preparation for application of a single-sided opening process ("SSOP"). The SSOP will be described in more detail below with respect to FIG. 2, block 208. In the meantime, according to some embodiments, the SSOP may include a wet etching process applied to the first surface 100a of the inorganic substrate 100, but not to the second surface 100b of the inorganic substrate. In this regard, according to block 206, second surface 100b may be protected, sealed, or blocked by applying an adhesive etch-resistant film on second surface 100b, according to some embodiments. Second surface 100b may also be protected, sealed, or blocked by temporarily bonding a carrier or blocking substrate, preferably an etch-resistant carrier or blocking substrate, to second surface 100b, according to some embodiments. If the temporary bond adhesive is polymeric, the polymer can wick into the via 30 formed in the DSOP and may adversely affect the SSOP. Accordingly, it may be preferable in some applications to protect, seal, or block second surface 100b by temporarily bonding a carrier or blocking substrate with a carbonaceous surface modification layer applied, according to some embodiments. In some embodiments, according to block 206 in FIG. 2 (e.g., after completion of the DSOP, but before applying the SSOP), an inorganic carbon-containing film may be deposited on a surface of a carrier or blocking substrate, and the inorganic carbon-containing film may be bonded to the second surface 100b of the inorganic substrate 100. The carrier or blocking substrate may be any substrate with sufficient mechanical properties and smoothness to adhere to the inorganic substrate 100 and protect, seal, or block penetration of etchant solution, and not be overly reactive to the etchant solution, according to some embodiments. Suitable carrier or blocking substrates that may be bonded to the second surface 100b of the inorganic substrate 100 after completion of the DSOP, but before applying the SSOP, include semiconductor substrates, including but not limited to, silicon and germanium, according to some embodiments. In some embodiments, it may be preferable to apply a surface-modifying layer on an inorganic blocking substrate, such as a silicon wafer, which creates a fluid-resistant yet temporary bond between the substrate 100 and the blocking substrate. In some embodiments, according to block 206 in FIG. 2, the second surface 100b of the inorganic substrate 100 is temporarily bonded to a semiconductor substrate using a deposited carbonaceous layer. The semiconductor substrate may be made of silicon.

Appropriate carbonaceous surface modification layers allow a higher adhesion force between the second surface 100b and the carrier or blocking substrate than simple Van der Waals interactions between the clean surfaces, yet remain temporary even after anneals to 400° C. Carbonaceous surface modification layers may include one or more layers or films which contain carbon as a significant component. The carbon may exist in the form of polymeric chains exhibiting finite molecular weight. Alternatively, the carbon may exist as a matrix of carbon atoms bonded to form an amorphous or crystalline solid film. The carbon may exhibit $sp^2$ bonding or $sp^3$ bonding, also referred to as $sp^2$ or $sp^3$ orbital hybridization. The carbonaceous surface modification layers may contain substantial quantities of other atoms. Preferred additional atoms may include hydrogen and fluorine, at concentrations below 50 atomic % relative to the entire film, or preferably below 40 atomic % relative to the entire film, according to various embodiments. Preferred carbonaceous surface modification layers may be amorphous carbon, amorphous hydrogenated carbon, diamond, diamond-like carbon, and fluorine containing carbon films, according to various embodiments. The carbonaceous surface modification layers may be deposited by any suitable deposition technique, according to some embodiments. Preferred deposition techniques may include vacuum deposition, preferably plasma enhanced chemical vapor deposition (PECVD), according to various embodiments. A particularly preferred deposition technique may be PECVD in the presence of a voltage-floating platen as used in reactive ion etch (RIE) systems, according to some embodiments. The carbonaceous surface modification layers may be of any desired thickness. Layer thickness below 100 nm may be preferred, according to some embodiments, and a particularly preferred layer thickness may be below 50 nm, according to some embodiments. The carbonaceous surface modification layers may include an exposed surface with very low roughness. The roughness of the surface may be below 10 nm, preferably below 1 nm in RMS roughness, according to some embodiments. The carbonaceous surface modification layers may be applied to either or both surfaces that are to be bonded. In a non-limiting example, the carbonaceous surface modification layers may be applied either to the surface of the glass substrate or to the surface of a silicon substrate that are to be bonded, or to both of the surfaces to be bonded. The surfaces to be bonded are the two surfaces from different substrates that are contacted during bonding, as opposed the two opposing surfaces of single substrate, according to some embodiments.

The bonding or bonding type between the inorganic substrate 100 and the carrier or blocking substrate may be of any type that permits the two substrates to remain in adhesion during all envisioned processing steps of at least the SSOP (e.g., according to block 208 in FIG. 2), but allows debonding without excessive force when required, according to some embodiments. A preferred method of bonding may be Van der Waals bonding, in which the substrates are held together due to Van der Waals forces resulting from atomic constituents present on the two surfaces (e.g., surface 100b of the inorganic substrate 100 and the surface of the carrier or blocking substrate) being bonded. Van der Waals forces may result in bonded substrates with bond energies ranging from 20 to 300 $mJ/m^2$ as measured by a razor insertion technique (see, e.g., Gillis, Peter P., et al., "Double-Cantilever Cleavage Mode of Crack Propagation", Journal of Applied Physics 35, 647 (1964)). Van der Waals bonds may be modified by treating surfaces to be bonded with processes including, but not limited to, cleaning, acid exposure, base exposure, plasma treatments, and ozone treatments, according to various embodiments. The bonding or bonding type may also include some number of covalent bonds that form at room temperature or above and serve to covalently connect moieties on the two respective surfaces. In this regard, in some embodiments, the bonding of the second surface 100b of the inorganic substrate 100 to the carrier or blocking substrate according to block 206 in FIG. 2 may be Van der Waals bonding or Van der Waals bonding assisted by covalent bonding. Van der Waals bonding assisted by a covalent bonding may be particularly preferred in some contexts since Van der Waals bonds alone may not be sufficient to hold the substrates in contact with each other during all anticipated wet processing. Typical covalent bonds may include siloxane bonds (—Si—O—Si—), and silicon bonds to any number of carbon-based groups that exist on the carbonaceous surface modification layers, according to various embodiments. Covalent bonds can be relatively strong, leading to bond energies of greater than 2000 mJ/m$^2$, resulting in bonds that are relatively difficult to debond in some contexts. Such a strong bond may be preferred in some situations where it is desired to leave the carrier or blocking substrate permanently bonded to the inorganic substrate 100. In other situations, it may be desirable to debond or remove the carrier or blocking substrate. In at least some of these cases, it may be preferable that the bond energy composed of Van der Waals forces and covalent boding forces, be less than 1000 mJ/m$^2$, preferably less than 800 mJ/m$^2$, according to various embodiments. After bonding, bonds may be modified or undergo any number of processes including annealing, compression, and wet treatments, according to some embodiments. Annealing may be at any suitable temperature, time, and environment, preferably at or below 400° C. and in an inert gaseous or vacuum environment, according to some embodiments.

According to some embodiments, the bonding process associated with block 206 in FIG. 2 may be performed by any method which brings the substrates to be bonded in contact and with suitable alignment. The process may include application of pressure or elevated temperatures. In some embodiments, it may be preferable that the surfaces of the substrates to be bonded be smooth enough so that the bond forms spontaneously, or progresses spontaneously after application of a point of contact between the two substrates by localized pressure.

Typically, in order to use any thin, non-compliant adhesion layer, such as a carbonaceous surface modification layer for bonding, the surfaces to be bonded may need to be clean and smooth, with RMS roughness below 10 nm, according to some embodiments. Prime silicon wafers typically have adequate cleanliness and smoothness as delivered commercially. In some embodiments, a silicon wafer is preferred as the carrier or blocking substrate according to block 206, because in addition to the smooth, bondable surface, a silicon semiconductor wafer can provide structural rigidity for easier handling, and silicon is not readily etched by the chemistries used to etch a glass substrate.

For the inorganic substrate 100, however, the starting roughness, details of the DSOP etchant solution composition, conditions of the etch bath including agitation and temperature, and time in the solution determine the roughness of the substrate surfaces after the etch, according to some embodiments. The roughness may be dramatically increased, essentially maintained, or in some cases decreased after the DSOP. In some embodiments, care should be taken to maintain a surface roughness of less than 2 nm after the DSOP, more preferably below 0.6 nm RMS in some contexts.

According to some embodiments, a method of facilitating formation of a via in an inorganic substrate may include (e.g., according to block 206 in FIG. 2) bonding a semiconductor substrate (e.g., as a carrier or blocking substrate) to a second surface 100b of an inorganic substrate 100. The inorganic substrate 100 may include a first opening (e.g., first opening 106a in FIG. 4, first opening 106a1 in FIG. 6A, or first opening 106a2 in FIG. 6B) in a first surface 100a of the inorganic substrate 100, the second surface 100b on an opposite side of the inorganic substrate 100 than the first surface 100a of the inorganic substrate 100. The inorganic substrate may include a first opening (e.g., first opening 106b in FIG. 4, first opening 106b1 in FIG. 6A, or first opening 106b2 in FIG. 6B) in the second surface 100b of the inorganic substrate 100 and may include a via or pathway 30 including the first opening in the first surface 100a of the inorganic substrate 100, the first opening in the second surface 100b of the inorganic substrate 100, and a channel (e.g., the interior region of the via or pathway 30 between the first opening in the first surface 100a and the second opening in the second surface 100b) extending from the first opening in the first surface 100a of the inorganic substrate 100 to or at least toward the first opening in the second surface 100b of the inorganic substrate 100. The via or pathway 30 may include a longitudinal axis 32 perpendicular to, e.g., (a) an extension direction 104a of the first surface 100a of the inorganic substrate 100, (b) an extension direction 104b of the second surface 100b of the inorganic substrate 100, or both (a) and (b). The channel may include varying diameters of lateral cross-sections taken perpendicular to the longitudinal axis 32 of the via or pathway 30. The via or pathway 30 may include a waist (e.g., at least waist W1 in FIG. 6A or waist W2 in FIG. 6B) coinciding with a lateral cross-section (e.g., the middle lateral cross-section 31 in FIG. 6C) taken perpendicular to the longitudinal axis 32 at a point of minimum diameter of the varying diameters of the channel.

After the second surface 100b of the inorganic substrate 100 is sealed, protected, or blocked to prevent or at least significantly reduce access of wet etch material according to some embodiments associated with block 206 in FIG. 2, the SSOP noted in FIG. 2, block 208 may be undertaken, according to some embodiments. According to various embodiments, the SSOP can be a dry-etch with plasma and reactant chemistry only accessing the first surface 100a, or may be a wet-etch process. The SSOP further enlarges the size of the via or pathway 30 from the accessible first surface 100a side of the inorganic substrate 100, and progressively moves the waist of the via or pathway 30 toward the sealed second surface 100b, according to some embodiments, as illustrated by a comparison of, e.g., at least FIG. 6B and FIG. 7A. Setting of etch conditions and properties for the SSOP can be important to control the type of etching that ensues.

To understand this control, it is useful to consider the dynamics of wet etching a via or pathway wherein the diameter of the initial opening is small compared to the thickness of the substrate. A fraction of the composition of the etching fluid is the active etching component, for example, hydrofluoric acid in some embodiments. When a glass substrate is immersed in a wet etching solution, on the one hand, there is the surface reaction rate for etching, specific to the chemistry and the inorganic substrate material. On the other hand, there is the diffusion rate, which governs how fast the active acid components can travel through the fluid in the via, to etch the via walls and be replenished after the etching reaction. In some embodiments, for the DSOP etching (e.g., according to block 204 in FIG. 2), the rate of diffusion can be designed to be larger than the surface reaction. In this case, active acid components can diffuse freely throughout the depth of the via, leading to a more constant rate of reaction along the depth of the via, and thus creating as large a waist as possible in the resulting hour-glass profile, according to some embodiments. However, for the SSOP (e.g., according to block 208 in FIG. 2), in some embodiments, the relative rate of diffusion can be designed to be small relative to the surface reaction rate, so that the etching deep in the hole is minimized relative to the etching close to the exposed surface 100a. In at least some of such embodiments, the hour-glass shape of the via (e.g., as shown in at least FIGS. 6A-6C) can be etched into an asymmetric via with a larger opening at the exposed surface 100a (e.g., as shown in at least FIGS. 7A-7C and 8, discussed in more detail below), and the waist of the via can be moved closer to the blocked surface 100*b* of the substrate 100, according to some embodiments.

Because, in some embodiments, the SSOP may employ conditions in which diffusion rate is small relative to surface reaction rate, small variations in mixing can lead to variations in the local etch rate across the wafer surface. In order to combat this, some embodiments may employ high mixing within the etch tank. High mixing may include high linear flows, with fluid movement across the substrate of greater than 1 cm/sec in some embodiments, and preferably greater than 5 cm/s in some embodiments. High mixing may also include rapid movement of the substrates within the etch vessel, including linear and rotational motion. Linear motion may be oscillatory with maximum speeds of greater than 1 cm/sec in some embodiments, and preferably greater than 5 cm/s in some embodiments. Rotational motion may be at speeds of greater than 5 rpm in some embodiments, and preferably greater than 10 rpm in some embodiments. High mixing may include other mixing approaches including but not limited to sparging, ultrasonics, and megasonics, according to some embodiments.

The relative rates of diffusion and surface reaction can be defined by the Thiele Modulus. For a cylindrical pore, the Thiele modulus ($h_T$) can be computed from equation (1):

$$h_T = \sqrt{\frac{2k_1 L^2}{rD_c}} \quad (1)$$

Where $k_1$ is the first order reaction rate constant, L is the length of the pore, r is the radius of the pore, and $D_c$ is the diffusion constant of the reactive component, such as the active acid component.

The term pore is used to refer to a generic cylindrical opening, such as a via. While a via may not be perfectly cylindrical, equation (1) is still appropriate to use as a figure of merit. In that case, r can be considered as ½ of the top via diameter, and L can be considered as the via length. For a DSOP, L may be ½ of the inorganic substrate thickness, since etching occurs from both sides, and for a SSOP, L may be the full thickness of the inorganic substrate, since etching occurs from only one side.

When $h_T$ is less than 1, it indicates that diffusion is fast relative to surface reaction, which may be desired for the DSOP to achieve a minimal waist, according to some embodiments. When $h_T$ is greater than 1, diffusion is slow relative to surface fraction, which may be preferred for the SSOP process to achieve desired movement of the waist closer to the blocked surface, according to some embodiments. For the SSOP (e.g., according to block 208 in FIG. 2), it may be preferred to have conditions that provide a value of $h_T$ greater than 1.1, and more preferably greater than 1.2 in various embodiments. For the SSOP (e.g., according to block 208 in FIG. 2), it may be preferred to have conditions that provide a value of $h_T$ in a range of 1.1 to 10 (inclusive) in some embodiments, and in a range of 2 to 10 (inclusive) in some embodiments. For the DSOP (e.g., according to block 204 in FIG. 2), it may be preferred to have conditions that provide a value of $h_T$ less than 0.9, and more preferably less than 0.8 in various embodiments. For the DSOP (e.g., according to block 204 in FIG. 2), it may be preferred to have conditions that provide a value of $h_T$ in a range of 0.1 to 0.9 (inclusive) in some embodiments, and in a range of 0.1 to 0.5 (inclusive) in some embodiments.

Figure 7A:
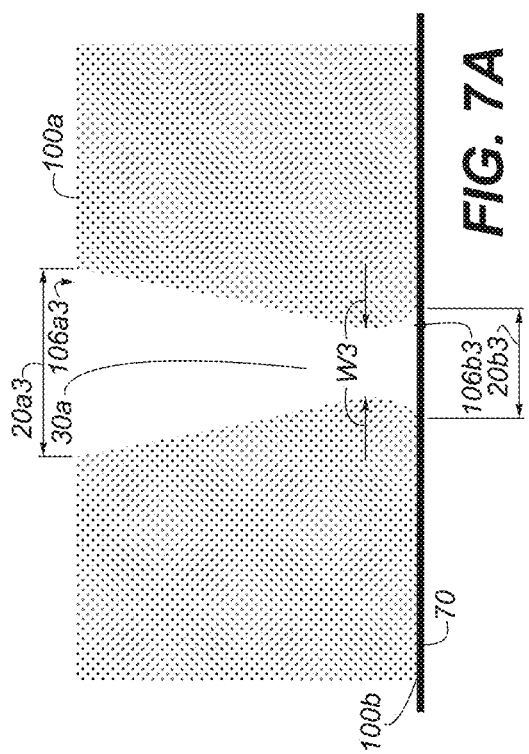
FIGS. 7A-7C illustrate examples of various vias after application of a single-sided opening process to a substrate and after application of a double-sided opening process, with reference to blocks 206 and 208 in FIG. 2, according to some embodiments of the present invention.
Figure 7B:
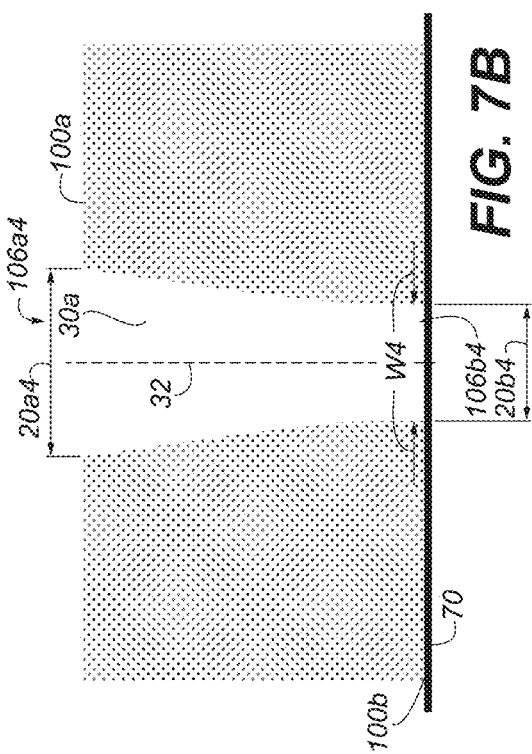
Figure 7C:
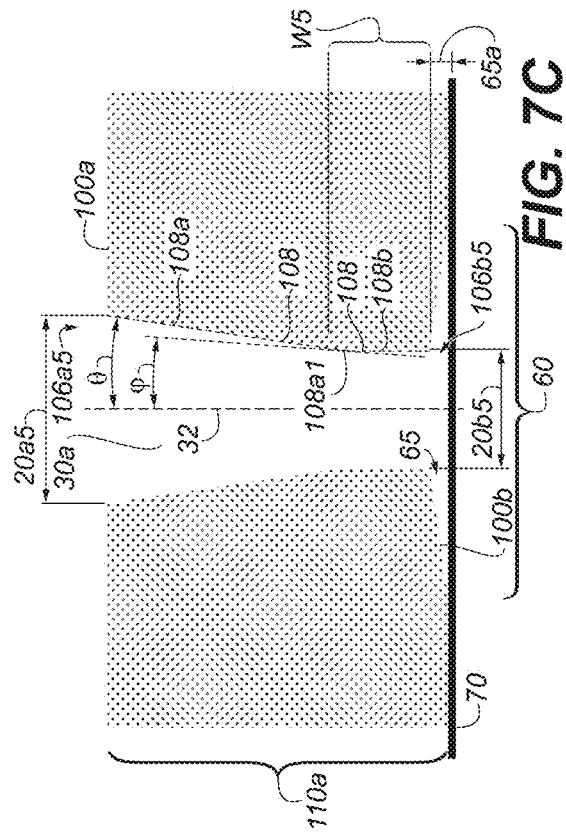
Figure 8:
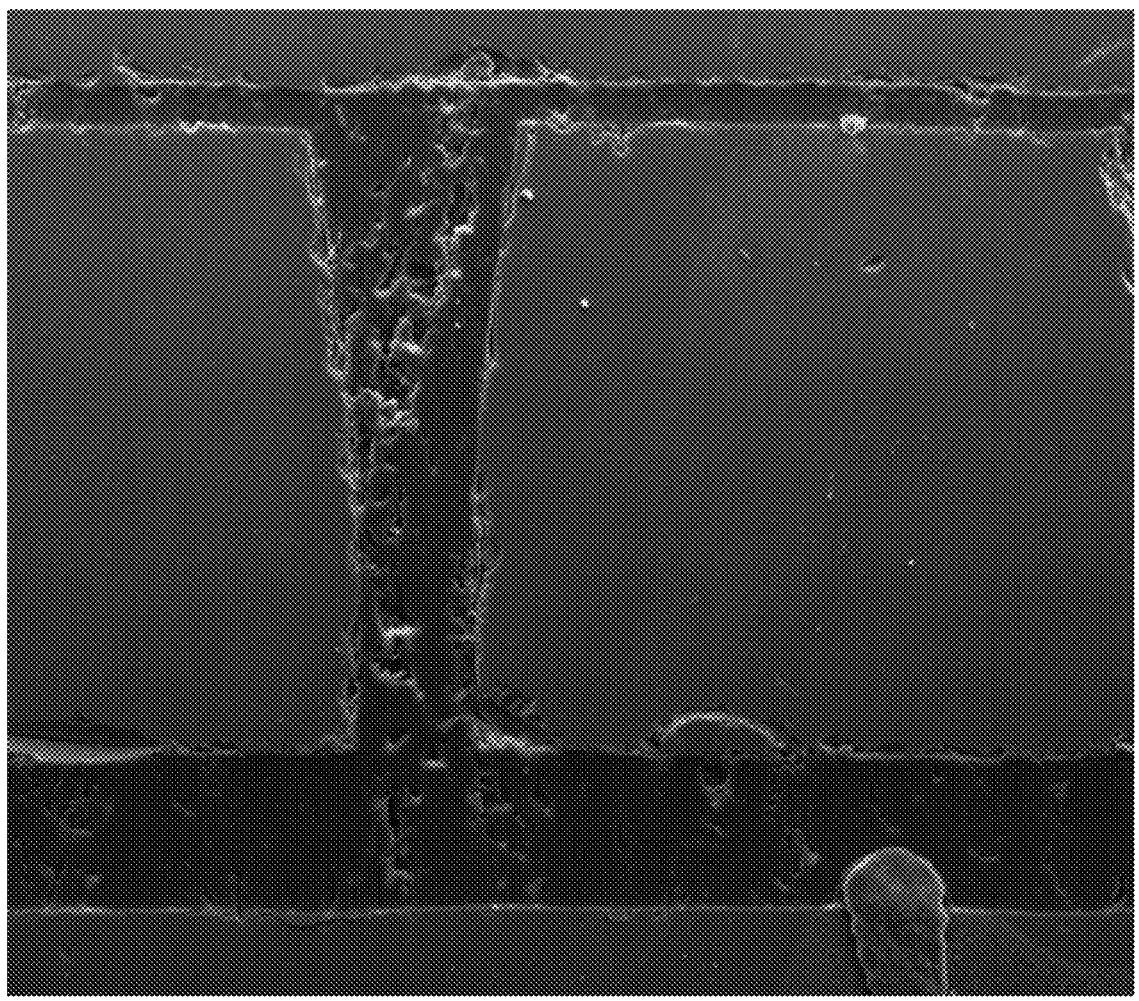
FIG. 8 is an image of an actual via formed according to methods illustrated by FIG. 2, according to some embodiments of the present invention.

In some embodiments, one advantage of applying the DSOP according to block 204 in FIG. 2 followed by the SSOP according to block 206 in FIG. 2 is that the diameter of the opening of the via or pathway 30 at the second surface 100*b* of the inorganic substrate 100 is determined primarily by the DSOP. This circumstance allows for a reduced duration of a single-sided etch in the SSOP to achieve the desired via opening (for example diameter 20*b*3, diameter 20*b*4, or diameter 20*b*5 as shown in FIGS. 7A-7C, respectively), as compared to a solely single-side etch that is not preceded by the DSOP, and, consequently, reduces the presence of undercutting or lateral etching at the interface between the second surface 100*b* of the inorganic substrate 100 and the carrier or blocking substrate (or other sealant). The subsequent SSOP is designed, according to some embodiments, to have relatively little effect on the size of the opening of the via or pathway 30 at the second surface 100*b* of the inorganic substrate 100. By design, according to some embodiments, the exposure of the interface between the second surface 100*b* of the inorganic substrate 100 and the carrier or blocking substrate (or other sealant) to the active species in the wet etch fluid is limited in time and concentration, because most of the etching is occurring closer to the unsealed first surface 100*a* of the inorganic substrate 100. Further, since the DSOP performs a significant amount of the formation of the via or pathway 30, the complete formation of the via is less dependent on the thickness of the inorganic substrate 100, as compared to the conventional solely single-sided etch described above with respect to FIGS. 1A-1C, which allows the inventive vias to have relatively smaller or at least more controlled opening sizes on the first surface 100*a*, and allows increased via densities.

Another advantage of applying the DSOP according to block 204 in FIG. 2 followed by the SSOP according to block 206 in FIG. 2 is that the resulting shape of the via lends itself to ready filling with electrically conductive material in subsequent processes. A via profile that does not contain a re-entrant portion may be preferred for single-side via filling. At first glance, it might appear that superimposing an etching process that tends to create a conical profile (SSOP) onto an hour-glass via profile (such as results from the DSOP) would not create a useful profile without reentrance. However, in some embodiments, by careful choice for the etching condition for the DSOP and then carefully tuning the etching conditions (e.g., choosing conditions distinctly optimized away from the conditions chosen for the DSOP) for the SSOP, it is possible to create a via profile without significant reentrance.

According to some embodiments, a method of facilitating formation of a via in an inorganic substrate may include (e.g., according to block 208 in FIG. 2) applying the SSOP to the first surface 100*a* of the inorganic substrate 100, after completion of the DSOP associated with block 204 in FIG. 2. The SSOP may enlarge at least a first dimension (e.g., diameter 20*a* in FIG. 4, diameter 20*a*1 in FIG. 6A, or diameter 20*a*2 in FIG. 6B) of the first opening (e.g., opening 106*a* in FIG. 4, opening 106*a*1 in FIG. 6A, or opening 106*a*2 in FIG. 6B) in the first surface 100*a* of the inorganic substrate 100 to form a second opening (e.g., opening 106*a*3 in FIG. 7A, opening 106*a*4 in FIG. 7B, or opening 106*a*5 in FIG. 7C) in the first surface 100*a* of the inorganic substrate 100, according to some embodiments. In some embodiments, the SSOP moves the waist of the via or pathway 30 closer to the second surface 100*b* of the inorganic substrate 100 as compared to a location of the waist after completion of the DSOP but before applying the SSOP, e.g., as illustrated by a comparison of at least (a) FIG. 6A or FIG. 6B with (b) FIG. 7A, FIG. 7B, or FIG. 7C. The moving of the waist may be considered to form a resultant via or pathway (e.g., resultant via or pathway 30*a* illustrated in FIG. 7). The SSOP causes a via (e.g., at least resultant via or pathway 30*a*) formed in the inorganic substrate 100 to include the second opening (e.g., opening 106*a*3 in FIG. 7A, opening 106*a*4 in FIG. 7B, or opening 106*a*5 in FIG. 7C) in the first surface 100*a* of the inorganic substrate, a resultant second opening (e.g., opening 106*b*3 in FIG. 7A, opening 106*b*4 in FIG. 7B, or opening 106*b*5 in FIG. 7C) in the second surface 100*b* of the inorganic substrate 100, and the resultant pathway 30*a*, the resultant pathway 30*a* extending from the second opening (e.g., opening 106*a*3 in FIG. 7A, opening 106*a*4 in FIG. 7B, or opening 106*a*5 in FIG. 7C) in the first surface 100*a* of the inorganic substrate 100 to the resultant second opening (e.g., opening 106*b*3 in FIG. 7A, opening 106*b*4 in FIG. 7B, or opening 106*b*5 in FIG. 7C) in the second surface 100*b* of the inorganic substrate 100, according to some embodiments. In some embodiments, the resultant second opening (e.g., opening 106*b*3 in FIG. 7A, opening 106*b*4 in FIG. 7B, or opening 106*b*5 in FIG. 7C) in the second surface 100*b* of the inorganic substrate 100 is the original first opening (e.g., opening 106*b* in FIG. 4, opening 106*b*1 in FIG. 6A, or opening 106*b*2 in FIG. 6B) in the second surface 100*b* of the inorganic substrate 100, subject to any effects on such original first opening due to the application of the SSOP, which, in some embodiments, is nil or relatively minimal. In this regard, in some embodiments, the resultant second opening (e.g., opening 106*b*3 in FIG. 7A, opening 106*b*4 in FIG. 7B, or opening 106*b*5 in FIG. 7C) in the second surface 100*b* of the inorganic substrate 100 is equal to in size, or slightly larger than the original first opening (e.g., opening 106*b* in FIG. 4, opening 106*b*1 in FIG. 6A, or opening 106*b*2 in FIG. 6B) in the second surface 100*b* of the inorganic substrate 100, depending on the details of the etch applied in the SSOP, according to some embodiments. The position of the waist (e.g., waist W3 in FIG. 7A, waist W4 in FIG. 7B, or waist W5 in FIG. 7C), is preferably within 10% of the total thickness (remaining) of the inorganic substrate 100 from the second surface 100*b* of the inorganic substrate 100.

Referring to FIGS. 7A-7C, in some embodiments, the SSOP applied to the first surface 100*a* of the inorganic substrate 100, after completion of the DSOP, may result in a funnel-shaped, trumped-shaped, megaphone-shaped, frustum-shaped, or conical frustum-shaped resultant via or pathway 30*a*. In some embodiments, such as FIG. 7B, the resultant via or pathway 30*a* may be funnel-shaped, where the internal diameters of the resultant via or pathway 30*a* taken in a sequence of lateral cross-sections perpendicular to longitudinal axis 32 are consistent or relatively consistent over a length of the longitudinal axis 32 adjacent the blocked or sealed second surface 100*b*, at a value smaller than the diameter in the upper section (toward surface 100*a*) of the resultant via or pathway 30*a*. The region of the resultant via or pathway 30*a* adjacent the blocked or sealed second surface 100*b*, where the lateral cross-sections perpendicular to longitudinal axis 32 are consistent or relatively consistent, represents the smallest or approximately the smallest diameter or diameters of the resultant via or pathway 30*a* taken within one or more lateral cross-sections perpendicular to longitudinal axis 32. The SSOP moves the waist of the resultant via or pathway 30*a* closer to the second surface 100*b* of the inorganic substrate 100 as compared to a location of the waist after completion of the DSOP but before applying the SSOP, e.g., as illustrated by a comparison of at least (a) FIG. 6A or FIG. 6B with (b) FIG. 7A, FIG. 7B, or FIG. 7C, according to some embodiments. In some embodiments, the waist may be considered to apply to a region (rather than just a point) of minimum or near minimum internal diameter(s) of the resultant via or pathway 30*a*, as illustrated, e.g., by waist W5 in FIG. 7C.

According to some embodiments, during the SSOP, the size (e.g., diameter or area) of the opening in the first surface 100*a*, exposed directly to the etching solution, expands more than the other portions of the via or pathway. For example, referring to FIGS. 7A and 7B, the ratio of a diameter (e.g., diameter 20*a*3 in FIG. 7A or diameter 20*a*4 in FIG. 7B) of the second opening (e.g., opening 106*a*3 in FIG. 7A or opening 106*a*4 in FIG. 7B) in the first surface 100*a* of the inorganic substrate 100 to the corresponding diameter (e.g., diameter 20*b*3 in FIG. 7A or diameter 20*b*4 in FIG. 7B) of the resultant second opening (e.g., opening 106*b*3 in FIG. 7A or opening 106*b*4 in FIG. 7B) in the second surface 100*b* of the inorganic substrate 100 is in a range of 1.2 to 3 in some embodiments, in a range of 1.4 to 3 in some embodiments, in a range of 1.4 to 2 in some embodiments, and in a range of 1.2 to 2 in some embodiments. In some embodiments, the diameter (e.g., diameter 20*a*3 in FIG. 7A or diameter 20*a*4 in FIG. 7B) of the second opening (e.g., opening 106*a*3 in FIG. 7A or opening 106*a*4 in FIG. 7B) in the first surface 100*a* of the inorganic substrate 100 is at least 25% larger than the corresponding diameter (e.g., diameter 20*b*3 in FIG. 7A or diameter 20*b*4 in FIG. 7B) of the resultant second opening (e.g., opening 106*b*3 in FIG. 7A or opening 106*b*4 in FIG. 7B) in the second surface 100*b* of the inorganic substrate 100. The diameter of the second opening in the first surface 100*a* of the inorganic substrate 100 and the corresponding diameter of the resultant second opening in the second surface 100*b* of the inorganic substrate 100 are measured along parallel line segments, according to some embodiments. The expansion of the second opening (e.g., opening 106*a*3 in FIG. 7A or opening 106*a*4 in FIG. 7B) in the first surface 100*a* also expands more than the waist, according to some embodiments. As a result, the ratio of a diameter (e.g., diameter 20*a*3 in FIG. 7A or diameter 20*a*4 in FIG. 7B) of the second opening (e.g., opening 106*a*3 in FIG. 7A or opening 106*a*4 in FIG. 7B) in the first surface 100*a* of the inorganic substrate 100 to the corresponding diameter of the waist (e.g., waist W3 in FIG. 7A or waist W4 in FIG. 7B) of the resultant via or pathway 30*a* upon completion of the SSOP is in a range of 1.2 to 3 in some embodiments, in a range of 1.4 to 3 in some embodiments, in a range of 1.4 to 2 in some embodiments, and in a range of 1.2 to 2 in some embodiments. The diameter of the second opening in the first surface 100*a* of the inorganic substrate 100 and the diameter of the waist of the resultant via or pathway 30*a* are measured along parallel line segments, according to some embodiments. In cases in which the diameter of the resultant second opening in the second surface 100*b* is also the smallest diameter along the resultant via or pathway 30*a*, the resultant second opening can also be considered the waist of the resultant via or pathway 30*a*, according to some embodiments.

Upon completion of the SSOP, the resultant via or pathway 30*a* can have a variety of shapes, according to desired etching durations and parameters as discussed above, according to various embodiments. FIGS. 7A-7C show some various examples of possible shapes of the resultant via or pathway 30*a*, according to various some embodiments. As discussed above, the resultant via or pathway 30*a* may be funnel-shaped, trumpet-shaped, megaphone-shaped, frustum-shaped, or conical frustum-shaped. In contrast, for example, the via or pathway 30, after completion of the DSOP but before application of the SSOP, does not have a trumpet shape, a conical frustum shape, or any of these other shapes, but, instead, may have an hourglass shape, according to some embodiments, such as shown in at least FIG. 6A and FIG. 6B. In some embodiments, upon completion of the SSOP, a preferred shape of the resultant via or pathway 30a may be any shape in which the diameter of the resultant via or pathway 30a is decreasing, constant, or only minimally increasing in moving along the longitudinal axis 32 of the resultant via or pathway 30a from the first surface 100a (or at least the first plane 102a in which the first surface 100a resides) of the inorganic substrate 100 to the second surface 100b (or at least the second plane 102b in which the second surface 100b resides) of the inorganic substrate 100. 'Minimally increasing' may mean that, once a minimum diameter is reached in moving from the first surface 100a (or at least the first plane 102a in which the first surface 100a resides) to the second surface 100b (or at least the second plane 102b in which the second surface 100b resides), no subsequent diameter will be greater than 1.1 times that minimum diameter. A shape that has some increase in diameter in moving along the longitudinal axis 32 in this manner, such as that shown in the example of FIG. 7A, may be said to be reentrant or having reentrancy.

In some embodiments, upon completion of the SSOP, the openings of the resultant via or pathway 30a in the first surface 100a and the second surface 100b may have a circular shape. For example, a cross-section of the second opening (e.g., opening 106a3 in FIG. 7A, opening 106a4 in FIG. 7B, or opening 106a5 in FIG. 7C) in the first surface 100a of the inorganic substrate 100, taken perpendicular to a longitudinal axis (e.g., longitudinal axis 32) of the resultant via or pathway 30a, may have a circular shape, the longitudinal axis of the resultant via or pathway 30a perpendicular to, e.g., (a) an extension direction (e.g., extension direction 104a) of the first surface 100a of the inorganic substrate 100, (b) an extension direction (e.g., extension direction 104b) of the second surface 100b of the inorganic substrate 100, or both (a) and (b). Similarly, in some embodiments, a cross-section of the resultant second opening (e.g., opening 106b3 in FIG. 7A, opening 106b4 in FIG. 7B, or opening 106b5 in FIG. 7C) in the second surface 100b of the inorganic substrate 100, taken perpendicular to a longitudinal axis (e.g., longitudinal axis 32) of the resultant via or pathway 30a, may have a circular shape.

In some embodiments, the longitudinal cross-section or profile of the resultant via or pathway 30a, taken along the longitudinal axis 32 (i.e., within a plane in which the longitudinal axis 32 resides), may have substantially linear walls, which leads to a frustum or conical frustum shape of the resultant via or pathway 30a. A conical frustum may be defined as the shape produced when a cone, which has a base and a point or tip, is cut off by two planes parallel to the base, such that at least the point or tip is removed. Alternatively, the longitudinal cross-section or profile of the resultant via or pathway 30a may have curved walls. In some embodiments, each curved wall has a lower angle between it and the plane (e.g., plane 102a) in which the first surface 100a resides taken in a direction toward an interior of the resultant via or pathway 30a than the curved wall has between it and the plane (e.g., plane 102b) in which the second surface 100b resides taken in a direction toward an interior of the resultant via or pathway 30a, as shown in the example of FIG. 7B, according to some embodiments. Such a configuration leads to a trumpet shape of the resultant via or pathway 30a, in which the diameters of the lateral cross-sections (akin to lateral cross-sections 31) of the resultant via or pathway 30a as one progresses along the longitudinal axis 32 from the first surface 100a (or at least the first plane 102a in which the first surface 100a resides) to the second surface 100b (or at least the second plane 102b in which the second surface 100b resides) decrease more rapidly near the first surface 100a than near the second surface 100b. The frustum or trumpet shapes are a direct consequent of the SSOP, in which etching reactants have more access to portions of the opening near the first surface 100a than they do near the second surface 100b as a result of the blocked access at the second surface 100b described above with respect to block 206 in FIG. 2.

In some embodiments, within a two-dimensional profile of the resultant via or pathway 30a taken within a plane that includes the longitudinal axis 32 of the resultant via or pathway 30a (or channel thereof), such as the two-dimensional profile shown in FIG. 7C, a first angle θ of a first portion 108a of a wall 108 of the resultant via or pathway 30a at or adjacent the second opening 106a5 in the first surface 100a of the inorganic substrate 100 is at least two (2) degrees, in some embodiments, and preferably at least four (4) degrees in some embodiments, greater than a second angle φ of a second portion 108b of the wall 108 of the resultant via or pathway 30a at or adjacent the resultant second opening 106b5 in the second surface 100b of the inorganic substrate 100, each of the first angle θ and the second angle φ being taken between (i) the first portion 108a or the second portion 108b, respectively, of the wall 108 of the resultant via or pathway 30a, and (ii) the longitudinal axis 32 of the resultant via or pathway 30a. In some embodiments, the first angle θ of the first portion 108a of the wall 108 of the resultant via or pathway 30a at or adjacent the second opening 106a5 in the first surface 100a of the inorganic substrate 100 is between two (2) to eight (8) degrees (inclusive), in some embodiments, and between four (4) to eight (8) degrees (inclusive), in some embodiments, greater than the second angle φ of a second portion 108b of the wall 108 of the resultant via or pathway 30a at or adjacent the resultant second opening 106b5 in the second surface 100b of the inorganic substrate 100. In some embodiments, the first portion 108a is a span (e.g., the longest span in some embodiments) of the wall 108 between the first surface 100a and at least a portion (e.g., an initial portion 108a1 in some embodiments) of the waist (e.g., waist W5 in the example of FIG. 7C) closest to the first surface 100a in which the angle or slope of the wall is constant or substantially constant. Similarly, in some embodiments, the second portion 108b is a span (e.g., the longest span in some embodiments) of the wall 108 between the second surface 100b and the at least the portion (e.g., the initial portion 108a1 in some embodiments) of the waist (e.g., waist W5 in the example of FIG. 7C) closest to the first surface 100a in which the angle or slope of the wall is constant or substantially constant. In this regard, in some embodiments, the first portion 108a and the second portion 108b of the wall 108, which portions 108a, 108b are used to determine the first angle θ and the second angle φ, according to some embodiments, may be selected from respective regions of the wall 108 that are separated by a point of inflection (e.g., portion 108a1 in the example of FIG. 7C) in the angle or slope of the wall 108, such as may be present at the waist of the resultant via or pathway 30a. In some embodiments, the diameter of the second opening on the second surface 100b may be slightly larger than the waist, as exemplified in FIG. 7A with opening 106b3 having a diameter 20b3. In this case, a similar span to 108b from FIG. 7C would exhibit a negative angle φ.

Referring to FIG. 7C, in some embodiments, the SSOP moves the waist of the resultant via or pathway 30a closer to the blocked second surface 100b, as can be seen by comparing FIG. 4, FIG. 6A, or FIG. 6B to FIG. 7C. In the example of FIG. 7C, the wet-etch fluid used for the SSOP, according to some embodiments, also performs a lateral etch, shown by undercut region 65, at the interface between the surface 100b and the adhered surface of the protectant 70. The lateral etch can result from etch acceleration at the interface between blocked second surface 100b of inorganic substrate 100 and protectant 70. The extent of lateral etch can be limited relative to, for example, the case of not performing the DSOP and attempting to perform only a single sided etch on a substrate with a protectant, because in the case having first performed the DSOP, the first opening (e.g., at least first opening 106b2 in FIG. 6B, among others) in the second surface 100b is already fairly close in diameter to the diameter of the desired second opening (e.g., second opening 106b5 in FIG. 7C) in the second surface 100b, so the time the substrate spends in the wet-etch fluid for the SSOP may be determined by the time taken to move the waist W of the via or pathway closer to the second surface 100b of the inorganic substrate 100. The lateral extent of the lateral etching (shown by diameter 60 in FIG. 7C), also referred to as undercutting, can be larger than the diameter 20b5 of the second opening 106b5 at the second surface 100b and can be larger than the diameter 20a5 of the second opening 106a5 at the first surface 100a. The waist W5 in the example of FIG. 7C of the resultant via or pathway 30a may have the same or substantially a same diameter over a distance along the longitudinal axis 32 in the resultant via or pathway 30a, forming a cylindrical section corresponding to the region of waist W5 extending to the second opening 106b5 close to the interface of the second surface 100b of the inorganic substrate 100 with the protectant layer 70. In this regard, when undercutting is present, the undercut region (e.g., region 65 of lateral etch in FIG. 7C) may be considered to not be part of the resultant via or pathway 30a, according to some embodiments. In some embodiments, if the distance 65a from the protectant 70 to the smallest diameter of the resultant via or pathway 30a is less than 10% in some embodiments, or less than 5% in some embodiments, of the etched substrate thickness (e.g., thickness 110a in FIG. 7C), then the undercut region (e.g., region 65 of lateral etch in FIG. 7C) or undercutting may be considered to be a footer rather than part of the resultant via or pathway 30a, and the diameter (e.g., diameter 20b5) is considered to be the diameter of the second opening 106b5 in second surface 100b of the inorganic substrate 100. In FIG. 7C, this interpretation is also illustrated by the representation that the second surface 100b of the inorganic substrate 100 includes a surface of the undercut region (e.g., region 65 of lateral etch in FIG. 7C) on the inorganic substrate 100. In this case, when considering the plane in which the second surface 100b extends, such plane may still be considered to be like plane 102b shown in FIG. 3, since, excluding the undercut region (e.g., region 65 of lateral etch in FIG. 7C), the second surface 100b still generally extends within that plane. In such a case, the resultant via or pathway 30a may still be considered to be tapered, but to also comprise a footer or undercut region (e.g., region 65 of lateral etch in FIG. 7C). On the other hand, in some embodiments, if the undercutting is severe enough that the vertically measured distance 65a from the sealed surface (e.g., protectant 70) of the inorganic substrate 100 to the position of the narrowest diameter (e.g., diameter 20b5) opening (e.g., second opening 106b3) in the resultant via or pathway 30a is greater than 5% in some embodiments or greater than 10% in some embodiments of the etched substrate thickness (e.g., thickness 110a in FIG. 7C), then the resultant via or pathway 30a may be considered to be one with a waist and not a tapered through-hole, according to some embodiments. Referring back to the case that the undercutting is considered to be a footer as described above, the diameter 60 of the undercut region (e.g., region 65 of lateral etch in FIG. 7C) may be produced to be as small as possible, according to some embodiments. The diameter 60 of undercut region (e.g., region 65 of lateral etch in FIG. 7C) may be less than four times the diameter 20b5 of the second opening 106b5 in the second surface 100b in some embodiments, and preferably less than three times the diameter 20b5 of the second opening 106b5 in the second surface 100b of the inorganic substrate 100, according to some embodiments.

According to some embodiments, a method of facilitating formation of a via in an inorganic substrate may include (e.g., according to block 208 in FIG. 2) applying a SSOP to the first surface 100a of the inorganic substrate 100, after bonding a carrier or blocking semiconductor substrate to the second surface 100b of the inorganic substrate 100 (e.g., according to block 206 in FIG. 2). The SSOP may enlarge at least a first dimension (e.g., diameter 20a in FIG. 4, diameter 20a1 in FIG. 6A, or diameter 20a2 in FIG. 6B) of the first opening (e.g., opening 106a in FIG. 4, opening 106a1 in FIG. 6A, or opening 106a2 in FIG. 6B) in the first surface 100a of the inorganic substrate 100 to form a second opening (e.g., opening 106a3 in FIG. 7A, opening 106a4 in FIG. 7B, or opening 106a5 in FIG. 7C) in the first surface 100a of the inorganic substrate 100. The SSOP may cause the resultant via or pathway 30a to include the second opening in the first surface 100a of the inorganic substrate 100 and a resultant second opening (e.g., opening 106b3 in FIG. 7A, opening 106b4 in FIG. 7B, or opening 106b5 in FIG. 7C) in the second surface 100b of the inorganic substrate 100 with a channel (e.g., the interior region of the resultant via or pathway 30a between the first opening in the first surface 100a and the second opening in the second surface 100b) of the resultant via or pathway 30a extending from the second opening in the first surface 100a of the inorganic substrate 100 to the resultant second opening in the second surface 100b of the inorganic substrate 100, and the SSOP moving the waist of the via or pathway closer to the second surface 100b of the inorganic substrate 100 (e.g., as shown by at least a comparison of FIG. 6 to FIG. 7), according to some embodiments.

Example

A useful via with a trumpet shape was produced by a combination of a double-sided opening process followed by a single-sided opening process according an embodiment of the present invention.

An inorganic substrate composed of Corning Willow (Willow is a registered Trademark of Corning Incorporated, One Riverfront Plaza, Corning, New York 14831, USA) glass of a thickness of 125 microns was laser processed to produce damage tracks. The substrate was cleaned by scrubbing with a 2% solution of Valtron (Valtron is a registered Trademark of Valtech Corporation, 2113 Sanatoga Station Rd., Pottstown, PA 19464, USA) 2200 surfactant, using a PVA brush, followed by additional cleaning with a solution of approximately 1 part 30% $H_2O_2$ to 1 part 30% ammonium hydroxide to 12 parts water by volume, maintained at 50° C. Additional $O_2$ plasma cleaning was then performed to ensure that all organic contamination is removed from the glass surface.

The glass was etched in a solution of 0.4M HF and 1.8M hydrochloric acid (HCl), maintained at approximately 12° C., for 2 hrs. The solution was lightly agitated with megasonics agitation. After this double-sided opening process, the damage tracks had been enlarged to openings on either surface of the substrate to approximately 16 microns.

The resulting glass was cleaned with a plasma treatment and then received a carbonaceous layer as described above. The resulting glass was then bonded to a silicon wafer on which a carbonaceous layer was also deposited. The bonding is a spontaneous process in which the two samples are brought into contact and the bond progresses between the two substrates.

The resulting bonded pair was etched in a solution 0.4M HF and 1.8M HCl, maintained at approximately 40° C., for 40 minutes with light megasonics agitation. Due to the blocking of one side of the substrate with the silicon wafer, the etching occurs predominantly on the other side of the glass substrate. The resulting via is shown in SEM cross section in FIG. 8, with the darker region representing the interior of the via (filled with polymer for the SEM cross section process). The top diameter of the via is approximately 32 microns, while the bottom diameter of the via is 19 microns. The via has a trumpet shape with little to no reentrancy, and is suitable for typical via fill/metallization plating approaches.

Subsets or combinations of various embodiments described above provide further embodiments. These and other changes can be made to the invention in light of the above-detailed description and still fall within the scope of the present invention. In general, in the following claims, the terms used should not be construed to limit the invention to the specific embodiments disclosed in the specification. Accordingly, the invention is not limited by the disclosure, but instead its scope is to be determined entirely by the following claims.

What is claimed is:

1. A method of facilitating formation of a via in an inorganic substrate, the method comprising:
    applying a double-sided opening process to the inorganic substrate, the inorganic substrate comprising a damage track having a first end in a first surface of the inorganic substrate and a second end in a second surface of the inorganic substrate, the second surface on an opposite side of the inorganic substrate than the first surface of the inorganic substrate, the double-sided opening process enlarging at least a first dimension of the first end of the damage track to form a first opening in the first surface of the inorganic substrate, the first dimension of the first end of the damage track measured within a plane of the first surface of the inorganic substrate, and the double-sided opening process enlarging at least a first dimension of the second end of the damage track to form a first opening in the second surface of the inorganic substrate, the first dimension of the second end of the damage track measured within a plane of the second surface of the inorganic substrate, a pathway extending between the first opening in the first surface of the inorganic substrate and the first opening in the second surface of the inorganic substrate, the pathway including a longitudinal axis perpendicular to (a) an extension direction of the first surface of the inorganic substrate, (b) an extension direction of the second surface of the inorganic substrate, or both (a) and (b), the pathway including varying diameters of lateral cross-sections taken perpendicular to the longitudinal axis of the pathway, the pathway including a waist coinciding with a lateral cross-section of the pathway taken perpendicular to the longitudinal axis at a point of minimum diameter of the varying diameters of the pathway; and
    applying a single-sided opening process to the first surface of the inorganic substrate, after completion of the double-sided opening process, the single-sided opening process enlarging at least a first dimension of the first opening in the first surface of the inorganic substrate to form a second opening in the first surface of the inorganic substrate, the single-sided opening enlargement process moving the waist of the pathway closer to the second surface of the inorganic substrate as compared to a location of the waist after completion of the double-sided opening process but before applying the single-sided opening process, the moving of the waist forming a resultant pathway, the single-sided opening process causing a via formed in the inorganic substrate to comprise the second opening in the first surface of the inorganic substrate, a resultant second opening in the second surface of the inorganic substrate, and the resultant pathway, the resultant pathway extending from the second opening in the first surface of the inorganic substrate to the resultant second opening in the second surface of the inorganic substrate.

2. The method of claim 1, wherein the double-sided opening process comprises a wet etching process concurrently applied to the first surface of the inorganic substrate and the second surface of the inorganic substrate.

3. The method of claim 1, wherein the single-sided opening process comprises a wet etching process applied to the first surface of the inorganic substrate, but not to the second surface of the inorganic substrate.

4. The method of claim 1, wherein the inorganic substrate is glass.

5. The method of claim 1,
    wherein a ratio of (a) a diameter of the second opening in the first surface of the inorganic substrate to (b) a diameter of the resultant second opening in the second surface of the inorganic substrate is in a range of 1.2 to 3, and
    wherein the diameter of the second opening in the first surface of the inorganic substrate and the diameter of the resultant second opening in the second surface of the inorganic substrate are measured along parallel line segments.

6. The method of claim 1,
    wherein a ratio of (a) a diameter of the second opening in the first surface of the inorganic substrate to (b) a diameter of the waist of the resultant pathway upon completion of the single-sided opening process is in a range of 1.2 to 3, and
    wherein the diameter of the second opening in the first surface of the inorganic substrate and the diameter of the waist of the resultant pathway are measured along parallel line segments.

7. The method of claim 1,
    wherein a diameter of the first opening in the second surface of the inorganic substrate is within 20% of a corresponding diameter of the resultant second opening in the second surface of the inorganic substrate, and
    wherein the diameter of the first opening in the second surface of the inorganic substrate and the corresponding diameter of the resultant second opening in the second surface of the inorganic substrate are measured along parallel line segments.

8. The method of claim 1, wherein, after completion of the single-sided opening process, the resultant pathway has a trumpet shape or a conical frustum shape.

9. The method of claim 1, comprising bonding a semiconductor substrate to the second surface of the inorganic substrate after completion of the double-sided opening process, but before applying the single-sided opening process.

10. The method of claim 9, wherein the bonding is Van der Waals bonding or Van der Waals bonding assisted by covalent bonding.

11. The method of claim 1, comprising temporarily bonding the inorganic substrate to a semiconductor substrate using a deposited carbonaceous layer.

12. The method of claim 11, wherein the deposited carbonaceous layer comprises an amorphous carbon, an amorphous hydrogenated carbon, a diamond, a diamond-like carbon, or a fluorine containing carbon film.

13. The method of claim 1, comprising, after completion of the double-sided opening process, but before applying the single-sided opening process, depositing an inorganic carbon-containing film on a surface of a blocking substrate and bonding the inorganic carbon-containing film to the second surface of the inorganic substrate.

14. The method of claim 1, wherein the double-sided opening process produces a via through the inorganic substrate from the damage track.

15. The method of claim 1, wherein the single-sided opening process occurs with etching conditions exhibiting a Thiele modulus greater than 1.1, and the double-sided opening process occurs with etching conditions exhibiting a Thiele modulus less than 0.9.

16. The method of claim 1, wherein, prior to applying the double-sided opening process, a thickness of the inorganic substrate is between 300 micrometers and 10 micrometers.

* * * * *